(12) United States Patent
Jenkins

(10) Patent No.: US 10,505,549 B1
(45) Date of Patent: Dec. 10, 2019

(54) POWER-SAVING PHASE ACCUMULATOR

(71) Applicant: Perceptia IP Pty Ltd, Kurraba Point (AU)

(72) Inventor: Julian Jenkins, Kurraba Point (AU)

(73) Assignee: Perceptia IP Pty Ltd, Kurraba Point, NSW (AU)

( * ) Notice: Subject to any disclaimer, the term of this patent is extended or adjusted under 35 U.S.C. 154(b) by 0 days.

(21) Appl. No.: 16/413,388

(22) Filed: May 15, 2019

Related U.S. Application Data

(60) Provisional application No. 62/671,822, filed on May 15, 2018.

(51) Int. Cl.
| | |
|---|---|
| *H03K 21/00* | (2006.01) |
| *H03K 21/02* | (2006.01) |
| *H03K 3/037* | (2006.01) |
| *H03K 5/14* | (2014.01) |
| *H03K 5/00* | (2006.01) |
| *H03M 7/30* | (2006.01) |
| *H03M 7/16* | (2006.01) |

(52) U.S. Cl.
CPC ............. *H03K 21/02* (2013.01); *H03K 3/037* (2013.01); *H03K 5/14* (2013.01); *H03K 2005/00078* (2013.01); *H03M 7/16* (2013.01); *H03M 7/6011* (2013.01)

(58) Field of Classification Search
CPC ........ H03K 21/00; H03K 21/02; H03K 23/66; H03K 23/82; H03K 3/037; H03K 5/14; H03K 2005/00078; H03M 7/16; H03M 7/6011; H04L 25/03038; H04L 25/03133
See application file for complete search history.

(56) References Cited

U.S. PATENT DOCUMENTS

| | | | |
|---|---|---|---|
| 7,003,064 B2 * | 2/2006 | Drerup | H04L 7/0008 375/371 |
| 2016/0277030 A1 * | 9/2016 | Burbano | H03K 23/40 |

* cited by examiner

*Primary Examiner* — Long Nguyen
(74) *Attorney, Agent, or Firm* — André Grouwstra

(57) ABSTRACT

A PLL includes a controlled oscillator, a phase accumulator to measure the controlled oscillator output phase, a phase predictor to calculate the required output phase, and a phase subtractor to calculate the phase difference or phase error. The phase accumulator includes a fast counter and a low-power counter, and two sets of corresponding latches. The fast counter counts cycles of the controlled oscillator clock signal, and the low-power counter counts carry signals from the fast counter. The low-power counter represents one or more most significant bits of the integer part of the measured phase, and the fast counter represents the remaining bits. The phase accumulator may further include a delay line, second latches, and a delay line decoder to measure a fractional part of the phase. A calibration feedback loop may keep the number of delay line steps per output clock pulse known and stable.

9 Claims, 18 Drawing Sheets

400

| | | | | | | |
|---|---|---|---|---|---|---|
| 0 | 0 | 0 | 0 | 0 | 0 | 0 |
| 0 | 0 | 0 | 0 | 0 | 1 | 1 |
| 0 | 0 | 0 | 0 | 1 | 1 | 2 |
| 0 | 0 | 0 | 0 | 1 | 0 | 3 |
| 0 | 0 | 0 | 1 | 1 | 0 | 4 |
| 0 | 0 | 0 | 1 | 0 | 0 | 5 |
| 0 | 0 | 1 | 1 | 0 | 0 | 6 |
| 0 | 0 | 1 | 0 | 0 | 0 | 7 |
| 0 | 1 | 1 | 0 | 0 | 0 | 8 |
| 0 | 1 | 0 | 0 | 0 | 0 | 9 |
| 0 | 1 | 0 | 0 | 0 | 1 | 10 |
| 0 | 1 | 0 | 0 | 1 | 1 | 11 |
| 0 | 1 | 0 | 0 | 1 | 0 | 12 |
| 0 | 1 | 0 | 1 | 1 | 0 | 13 |
| 0 | 1 | 0 | 1 | 0 | 0 | 14 |
| 0 | 1 | 1 | 1 | 0 | 0 | 15 |
| 0 | 1 | 1 | 0 | 0 | 0 | 16 |
| 0 | 1 | 1 | 0 | 0 | 1 | 17 |
| 0 | 1 | 1 | 0 | 1 | 1 | 18 |
| 0 | 1 | 1 | 0 | 1 | 0 | 19 |
| 0 | 1 | 1 | 1 | 1 | 0 | 20 |
| 0 | 1 | 1 | 1 | 0 | 0 | 21 |
| 0 | 1 | 1 | 1 | 0 | 1 | 22 |
| 0 | 1 | 1 | 1 | 1 | 1 | 23 |
| 1 | 1 | 1 | 1 | 1 | 1 | 24 |
| 1 | 1 | 1 | 1 | 0 | 1 | 25 |
| 1 | 1 | 1 | 1 | 0 | 0 | 26 |
| 1 | 1 | 1 | 1 | 1 | 0 | 27 |
| 1 | 1 | 1 | 0 | 1 | 0 | 28 |
| 1 | 1 | 1 | 0 | 1 | 1 | 29 |
| 1 | 1 | 1 | 0 | 0 | 1 | 30 |
| 1 | 1 | 1 | 0 | 0 | 0 | 31 |
| 1 | 1 | 1 | 1 | 0 | 0 | 32 |
| 1 | 1 | 0 | 1 | 0 | 0 | 33 |
| 1 | 1 | 0 | 1 | 1 | 0 | 34 |
| 1 | 1 | 0 | 0 | 1 | 0 | 35 |
| 1 | 1 | 0 | 0 | 1 | 1 | 36 |
| 1 | 1 | 0 | 0 | 0 | 1 | 37 |
| 1 | 1 | 0 | 0 | 0 | 0 | 38 |
| 1 | 1 | 1 | 0 | 0 | 0 | 39 |
| 1 | 0 | 1 | 0 | 0 | 0 | 40 |
| 1 | 0 | 1 | 1 | 0 | 0 | 41 |
| 1 | 0 | 0 | 1 | 0 | 0 | 42 |
| 1 | 0 | 0 | 1 | 1 | 0 | 43 |
| 1 | 0 | 0 | 0 | 1 | 0 | 44 |
| 1 | 0 | 0 | 0 | 1 | 1 | 45 |
| 1 | 0 | 0 | 0 | 0 | 1 | 46 |
| 1 | 0 | 0 | 0 | 0 | 0 | 47 |

$R_N$      2048
$f_{DCO\_MAX}$      1,000.0

| K | bits | # bands | range |
|---|---|---|---|
| 2048 | 11 | 1 | 1,000.0 |
| 1024 | 10 | 2 | 500.0 |
| 512 | 9 | 4 | 250.0 |
| 256 | 8 | 8 | 125.0 |
| 128 | 7 | 16 | 62.5 |
| 64 | 6 | 32 | 31.3 |
| 32 | 5 | 64 | 15.6 |
| 16 | 4 | 128 | 7.8 |
| 8 | 3 | 256 | 3.9 |
| 4 | 2 | 512 | 2.0 |
| 2 | 1 | 1024 | 1.0 |

$$K1_{MAX} < R_N = \frac{f_{DCOMAX}}{f_{REFMIN}}$$

2100

```
2101   range_ext_steps = 0;
2102   last_phase_difference = phase_difference;
2103   phase_difference = phase_prediction - phase_measurement +
       range_ext_steps * K;
2104   phase_diff_diff = phase_difference – last_phase_difference;
2105
2106   if (phase_diff_diff >= K/2) {
2107           range_ext_steps -= 1;
2108           phase_difference -= K;
2109   }
2110   else if (phase_diff_diff < -K/2) {
2111           range_ext_steps += 1;
2112           phase_difference += K;
2113   }
2114   goto 2102
```

```
2201   range_ext_steps = 0;
2202   last_phase_difference = phase_difference;
2203   phase_difference = phase_prediction - phase_measurement;
2204   phase_diff_diff = phase_difference – last_phase_difference;
2205
2206   if (phase_diff_diff >= K/2) {
2207           range_ext_steps -= 1;
2208   }
2209   else if (phase_diff_diff < -K/2) {
2210           range_ext_steps += 1;
2211   }
2212   ext_phase_difference = phase_difference + range_ext_steps *
       K;
2214   goto 2102
```

| | | |
|---|---|---|
| 7 | 01 | 11 |
| 6 | 01 | 10 |
| 5 | 01 | 01 |
| 4 | 01 | 00 |
| 3 | 00 | 11 |
| 2 | 00 | 10 |
| 1 | 00 | 01 |
| 0 | 00 | 00 |
| -1 | 11 | 11 |
| -2 | 11 | 10 |
| -3 | 11 | 01 |
| -4 | 11 | 00 |
| -5 | 10 | 11 |
| -6 | 10 | 10 |
| -7 | 10 | 01 |
| -8 | 10 | 00 |

Increment when:
current value = 0
prior value = -1

Decrement when:
current value = -1
prior value = 0

```
2501   range_ext_steps = 0;
2502   last_phase_difference_msb = phase_difference_msb;
2503   phase_difference = phase_prediction – phase_measurement;
2504   phase_difference_msb = MSB(phase_difference, 2);
2505
2506   if ((last_phase_difference_msb == 0) &&
          (phase_difference_msb == -1)) {
2507         range_ext_steps -= 1;
2508   }
2509   else if ((last_phase_difference_msb == -1) &&
               (phase_difference_msb == 0)) {
2510         range_ext_steps += 1;
2511   }
2512   phase_difference += range_ext_steps * K;
2513   goto 2502
```

FIG. 25

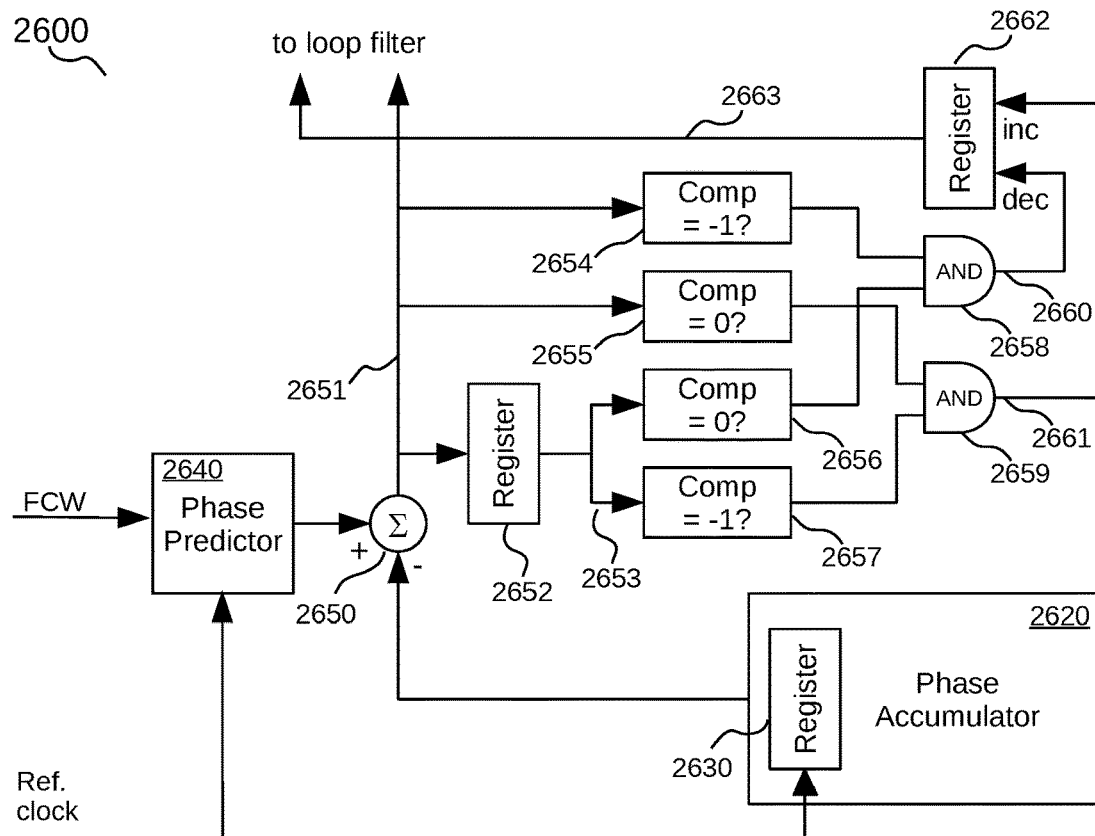

FIG. 26

POWER-SAVING PHASE ACCUMULATOR

CROSS REFERENCES TO OTHER APPLICATIONS

This application claims priority from U.S. Provisional Patent Application Ser. No. 62/671,822, entitled Digital Circuits and Methods for Phase-Locked Loops, filed on May 15, 2018, which is hereby incorporated by reference as if set forth in full in this application for all purposes.

This application is related to the following application, U.S. patent application Ser. No. 16/413,382, entitled Phase Accumulator with Improved Accuracy, filed concurrently herewith, which is hereby incorporated by reference, as if set forth in full in this specification.

This application is related to the following application, U.S. patent application Ser. No. 16/413,400, entitled PLL with Beat-Frequency Operation, filed concurrently herewith, which is hereby incorporated by reference, as if set forth in full in this specification.

This application is related to the following application, U.S. patent application Ser. No. 16/413,409, entitled PLL with Lock-in Frequency Controller, filed concurrently herewith, which is hereby incorporated by reference, as if set forth in full in this specification.

This application is related to the following application, U.S. patent application Ser. No. 16/413,396, entitled PLL with Phase Range Extension, filed concurrently herewith, which is hereby incorporated by reference, as if set forth in full in this specification.

BACKGROUND

The present invention relates generally to electronic circuits used to generate clock signals and more specifically to phase-locked loops (PLLs) manufactured in deep-submicron integrated circuit (IC) technologies.

Phase-Locked Loops are circuits that produce an output clock signal whose phase can be locked to the phase of an input reference clock signal. Phase, in the context of a PLL, means a signal's frequency value integrated over a time period. Therefore, the phase of the signal equals the number of clock cycles during the time period. The ratio of the frequency of the output clock signal and the frequency of the reference clock signal can be a positive integer number, in which case the PLL is called an integer-N PLL or an "integer PLL"; or it can be a positive rational number, in which case the PLL is called a fractional-N PLL or a "fractional PLL". Rational numbers are numbers that can be expressed as a ratio of two integers. In the context of this document, a fractional-N number is a positive rational number consisting of an integer part (obtained by rounding down to the nearest integer number) and a fractional part.

A PLL includes a controlled oscillator that produces the output clock signal. An analog PLL usually has an analog-controlled oscillator such as a voltage-controlled oscillator (VCO), and a digital PLL may have an analog-controlled oscillator or a digitally-controlled oscillator (DCO), which may include a digital-to-analog converter followed by an analog-controlled oscillator. A PLL locks the phase (and, as a result, frequency) of the output clock signal to the phase of the reference clock signal by measuring the accumulated number of output clock cycles and adjusting the controlled oscillator frequency when the measured number deviates from a required (or predicted) number, based on a frequency control word (FCW). The ratio of output clock cycles to reference clock cycles, measured over some duration, is called the PLL's multiplication factor. When a conventional PLL is in lock, its multiplication factor matches its FCW and its output frequency matches a target frequency defined as the reference clock frequency times the FCW.

Frequency-Locked Loops (FLLs) are circuits that produce an output clock signal whose frequency is locked to the frequency of an input reference clock signal. Compared to a PLL, an FLL lacks the integration or accumulation over time. A PLL's integration may occur anywhere in its loop, for example in feedback circuits, or in feedforward circuits such as a loop filter. Whereas a PLL in lock will lock both frequency and phase ratios in output and reference signals, an FLL may lock just the frequency ratio but not necessarily the phase ratio.

In an integer-N PLL, the spacing of possible output clock frequencies (also called the frequency resolution) typically equals the frequency of the reference clock signal, since the output clock frequency equals a positive integer number times the reference clock frequency. Increasing or decreasing the positive integer number by one will result in the output clock frequency increasing or decreasing by the reference frequency. A better output frequency resolution can be achieved by using a lower reference clock frequency. However, in practical PLLs this will often increase the jitter.

A fractional-N PLL can have a much better output clock frequency resolution without the need for a low reference clock frequency, as the ratio between the output clock and reference clock frequencies can be a positive rational number. An example of a fractional-N PLL is described in U.S. Pat. No. 8,994,523, entitled Phase-Locked Loop Apparatus and Method by Jenkins. The circuits described there provide very high accuracy and low jitter. However, new applications require ever higher speed, higher accuracy, a larger range, lower jitter, and lower power. To meet these requirements simultaneously, embodiments of the invention incorporate novel architectures and methods.

SUMMARY

A PLL, according to embodiments of the invention, includes a controlled oscillator (for example, a voltage-controlled oscillator VCO or digitally controlled oscillator DCO), a phase accumulator to measure the phase of the controlled oscillator output clock signal at times dictated by a reference clock signal, and a phase predictor to calculate a required phase of the controlled oscillator output clock signal at those times. A phase subtractor calculates a phase difference between the measured phase and the required phase. The phase subtractor forwards the phase difference via a loop filter to the controlled oscillator, to correct the frequency of the output clock signal.

The simplest phase accumulator comprises a counter and a register or latches. The controlled oscillator output frequency may be much higher than the clock frequency of any other signal in the PLL, or in the IC in which the PLL is used. To be able to respond to clock signals at the controlled oscillator output frequency, the counter and latches usually consume much power. This power is proportional to the counter and latches bit-width.

In an embodiment of the invention, the counter is split in a fast counter and a low-power counter, and the latches are split in first latches and third latches. The fast counter is configured to count cycles of the controlled oscillator clock signal. The low-power counter is configured to receive a fast counter carry signal, and count cycles of the carry signal. Upon receiving a reference clock signal, the first latches sample and store the value of the fast counter, and the third latches sample and store the value of the slow counter. Therefore, the output value of the third latches represent one or more most significant bits of the integer phase of the controlled oscillator clock signal, and the output value of the first latches represent the remaining bits of the integer phase.

In some embodiments, the fast counter and/or the low-power counter may feature an output sequence that changes only one bit per counted cycle, such as in a Gray code. These embodiments may further include one or two binary encoders, with inputs coupled with outputs of the first and/or third latches. The binary encoders convert the integer output phase represented in the output sequence to a binary number. In some embodiments, the binary encoders are, or include, a Gray-to-binary converter.

The phase accumulator may further include a delay line, second latches, and a delay line decoder. The delay line is configured to receive the controlled oscillator output clock signal. It has multiple output taps, along which the received controlled oscillator output clock signal propagates. The second latches are coupled with the delay line output taps and configured to sample and store delay line output tap values upon receiving the reference clock signal. The delay line decoder is coupled with outputs of the second latches. It is configured to translate a series of successive equal bit values that signify fractional progress of a controlled oscillator output clock signal pulse to a binary number representing the fractional output phase.

In further embodiments, the phase accumulator includes a calibrator with an input coupled with the delay line decoder output and with an output coupled with the delay line. The calibrator is configured to keep the number of delay line steps per output clock signal pulse stable, regardless of changes in operating conditions. It may do so by repeatedly measuring an actual number of delay line steps per output clock signal pulse and averaging results to obtain an accurate number. It may form a negative feedback loop with the delay line, second latches, and delay line decoder.

BRIEF DESCRIPTION OF THE DRAWINGS

The invention will be described with reference to the drawings, in which:

FIG. 4 illustrates an example sequence with one bit change per count according to an embodiment of the invention;

FIG. 21 illustrates pseudo code for a PLL with range extension according to an embodiment of the invention;

FIG. 22 illustrates alternative pseudo code for a PLL with range extension according to an embodiment of the invention;

FIG. 24 illustrates how a PLL can alternatively provide range extension according to an embodiment of the invention;

FIG. 25 illustrates pseudo code for the example in FIG. 24 for a PLL with range extension according to an embodiment of the invention;

FIG. 26 illustrates an example PLL with range extension for the method in FIGS. 24 and 25 according to an embodiment of the invention;

DETAILED DESCRIPTION

Examples in this Detailed Description may refer to the use of a digitally controlled oscillator (DCO), which may be controlled by an oscillator control code (OCC). All such examples equally apply for the use of an otherwise controlled oscillator, such as a voltage-controlled oscillator (VCO) or current-controlled oscillator (CCO), which may be controlled by an oscillator control signal (OCS). Embodiments employing a VCO, CCO, OCS are within the scope and ambit of the invention, unless expressly excluded.

Phase-Locked Loops (PLLs) are circuits that produce an output clock signal whose phase can be locked to the phase of a reference clock input signal. Phase, in the context of a PLL, means a signal's frequency value integrated over time, i.e. the signal's number of accumulated clock pulses. The ratio of the frequency of the output clock signal and the frequency of the reference clock signal can be a positive integer number, in which case the PLL is called an integer-N PLL or "integer PLL", or it can be a positive rational number, in which case the PLL is called a fractional-N PLL or "fractional PLL". Rational numbers are numbers that can be expressed as a ratio of two integers. In the context of this document, a fractional-N number is a positive rational number consisting of an integer part (obtained by rounding down to the nearest integer number) and a fractional part.

A digital PLL may measure the output clock phase, and compare the measured phase with a required or predicted phase. The required ratio may be configured or expressed by a frequency control word (FCW). The ratio of oscillator output clock cycles to input reference clock cycles is called the PLL's multiplication factor. When a conventional PLL is in lock, its multiplication factor matches its FCW. Embodiments of the invention perform measurement of the output phase in a phase accumulator. A phase predictor calculates a required phase, based on the reference clock and an FCW. The embodiments perform phase comparison using a digital subtractor (or adder). They filter the comparison result in a loop filter, and use the loop filter output to control the oscillator.

Figure 1:
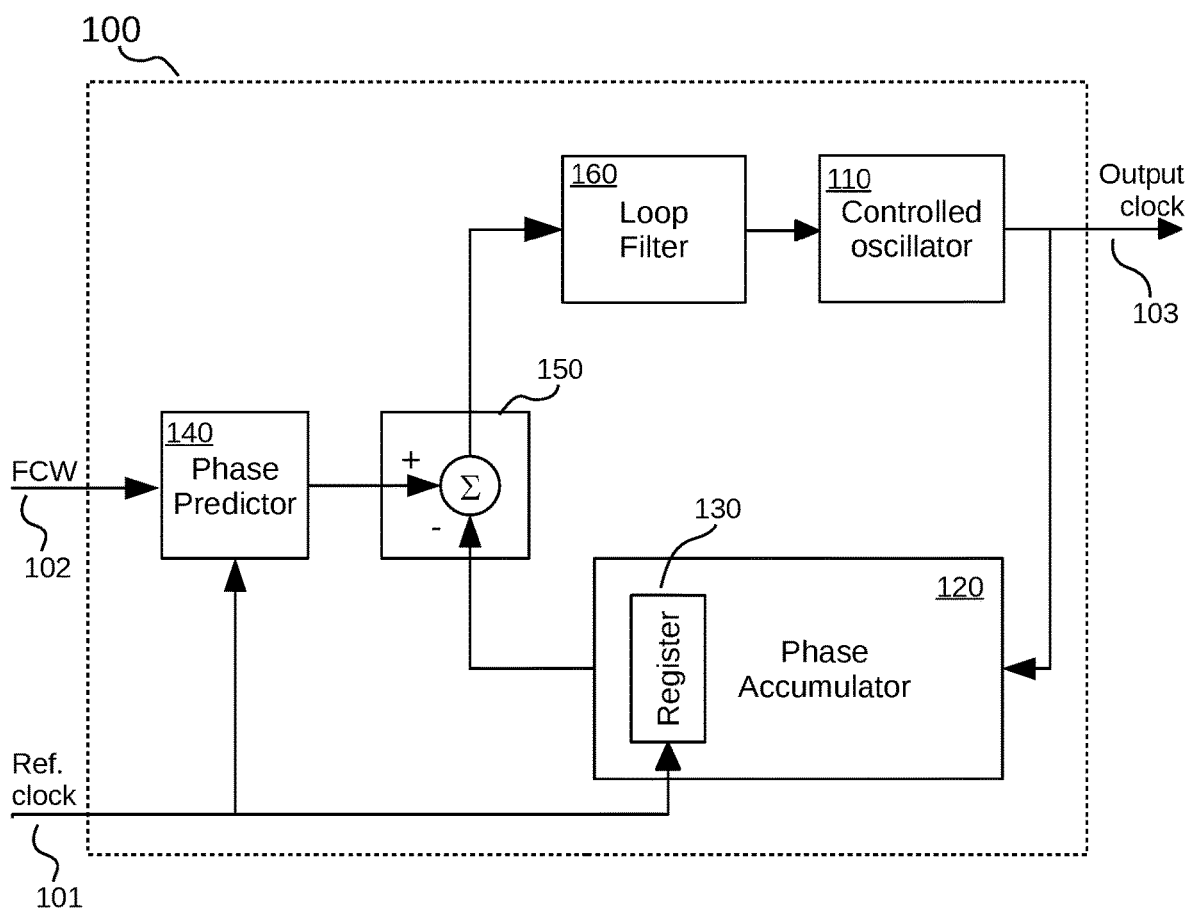
FIG. 1 illustrates a digital PLL according to an embodiment of the invention.

FIG. 1 illustrates a PLL 100 according to an embodiment of the invention. PLL 100 receives reference clock signal 101 and produces output clock signal 103. The frequency ratio of output clock signal 103 and reference clock signal 101 is determined by a FCW 102 that may include an integer and a fractional part. A controlled oscillator 110 generates output clock signal 103. Controlled oscillator 110 may be, or include, a digitally-controlled oscillator (DCO) or an otherwise controlled oscillator, such as a VCO or CCO. A phase accumulator 120 measures the output clock signal 103 phase by counting and/or measuring full and, if needed for accuracy, partial cycles of output clock signal 103. Therefore, the phase accumulator 120 output signal is representative of the output clock signal 103 phase. Upon receiving a reference clock signal 101 pulse, register 130 samples the output clock signal 103 phase, stores it, and makes it available at its output as the measured phase. This output value of register 130 is representative of the output clock signal 103 phase at the time of the most recent reference clock signal 101 active edge. Register 130 may include a set of parallel latches, for example D-latches with enable and data inputs, each latch for one bit of the output clock signal 103 phase, each latch triggered by reference clock signal 101 to measure the output clock signal 103 phase, and each latch providing a bit of measured phase at the register 130 output. In some embodiments, register 130 is located inside and/or part of phase accumulator 120, and in other embodiments it may be external to phase accumulator 120 but receive its input signal from phase accumulator 120.

While examples of further details of phase accumulator 120 will be provided later in this document, several embodiments are possible. Perhaps the simplest embodiment is just a modulo-K counter. A modulo-K counter, for the purposes of this patent document, is a counter that counts a maximum of K pulses at an input, providing a unique counted value at an output, and that restarts at a start value upon counting every $K^{th}$ pulse. A modulo-K counter may count up or count down. The start value may be zero, or any other value. The counted value may be expressed as a binary number, or as any other representation of a number. Examples in this patent document are based on up-counting from a value 0 to a value K−1, after which the counter restarts at 0. However, mutatis mutandis, all examples are equally valid for counters counting down and/or starting at different values. The value of K may be fixed, or it may be programmable, or it may be made to vary over time.

A phase predictor 140 takes FCW 102, and upon receiving a reference clock signal 101 pulse, phase predictor 140 calculates a predicted phase. In its most simple form, the predicted phase equals a number of reference clock signal 101 cycles received by phase predictor 140, multiplied by FCW 102. In more sophisticated embodiments, phase predictor 140 applies noise shaping to move lower-frequency truncation noise to higher frequencies. The operation of phase predictor 140 has been described in detail in other documents, for example in U.S. Pat. No. 8,994,523, entitled Phase-Locked Loop Apparatus and Method by Jenkins. A phase subtractor 150 calculates a phase difference between the predicted phase at the phase predictor 140 output and the measured phase by subtracting the measured phase from the predicted phase. A loop filter 160 filters the phase difference to produce an oscillator control signal forwarded to controlled oscillator 110 to control the frequency of output clock signal 103. Loop filter 160 may be, or include, an analog filter, for example when the controlled oscillator 110 is a VCO, or it may be, or include, a digital filter, for example when controlled oscillator 110 is a DCO.

A PLL has a multiplication factor whose maximum value is determined by the highest possible controlled oscillator frequency divided by the lowest allowed reference frequency. The ratio includes integer number $R_N$, where $R_N$ stands for the range of integer numbers N. Traditionally, a fractional-N FCW includes integer number N, which may have any integer value up to $R_N$. It further includes a fraction of 1 that may be expressed as an integer value M below a maximum $R_M$, where $R_M$ stands for the range of the fraction of 1. When in lock, the PLL 100 multiplication factor is $f_{DCO}/f_{REF}=(N+M/R_M)$. A shorthand version of this is $f_{DCO}/f_{REF}=FCW$. Some embodiments of the invention have a different multiplication factor, as will be explained later with reference to FIG. 10.

The phase accumulator 120 and phase predictor 140 need to be able to track and predict the phase of output clock signal 103 over a sufficiently large range. An embodiment may provide equal ranges for phase accumulator 120 and phase predictor 140, or ranges that are different from each other. For phase accumulator 120 this range equals a value K: for example, upon reaching a counted value of K−1 output clock cycles, a counter inside phase accumulator 120 continues counting at 0. Traditionally, the range K needs to be large enough to count $R_N$ cycles of output clock signal 103 during one cycle of reference clock signal 101. To correct large phase errors, or to relock at the correct phase after lock has been temporarily lost, traditional PLLs use a large range K, for instance K>$2R_N$. This means that the range K of the counter (a modulo-K counter) is at least two times as large as a maximum number of output clock signal 103 cycles $R_N$ during a reference clock signal 101 cycle. Thus, the maximum value of a phase difference is not limited by the period of reference clock signal 101, but by the larger of K and a range of phase predictor 140. The range of phase predictor 140 is usually chosen to match the range K of phase accumulator 120. Some embodiments of the invention are capable of using K values that are smaller than $R_N$.

Phase Accumulator with Improved Accuracy

Figure 2:
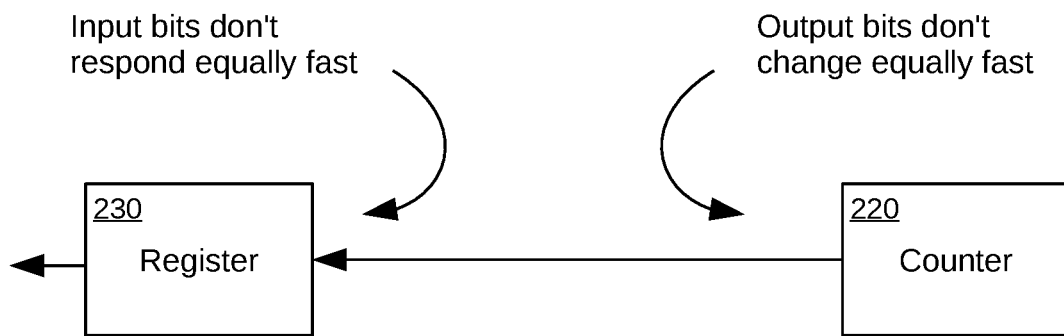
FIG. 2 illustrates some errors occurring in a phase accumulator.

FIG. 2 illustrates some errors occurring in a phase accumulator. The phase accumulator includes counter 220 and register 230. Jitter requirements in some PLLs can be as low as 100 femto-seconds ($10^{-13}$ s). For a semiconductor foundry process in which a simple logic gate can have a rise or fall time in the order of 10 pico-seconds ($10^{-11}$ s), even a small manufacturing variation can have a large impact. Manufacturing varies because its opto-lithographic production process uses light to etch structures whose size is much smaller than the light's wavelength. The error sources are both in counter 220 and register 230. For example, counter 220 receives a DCO clock signal which may have a frequency far above clock speeds that are used in an integrated circuit (IC) for clocking the rest of its logic. Therefore, the logic gates providing the counter 220 output bits need to respond very fast, and in full alignment. However, due to mismatching and variations in setup and hold time, some gates will change later than others, and errors are likely especially when many gates change their bit value at the same time. For example, in a conventional twelve-bit counter, all bits may need to change at the same time when the count goes from 2,047 to 2,048 (0111 1111 1111 to 1000 0000 0000). However, if not all bits switch at the same time, any individual bit can be in error and hence a value sampled near the time of transition may result in a number that is neither 2,047, nor 2,048. As all bits are changing, the result may be any value between 0 and 4095. The result may be not at all close to the correct value. Similarly, register 230 must respond very fast—but used at their top speed, some input gates may not capture fast-changing input bits in time. This problem occurs especially when a PLL's reference clock and DCO clock active edges occur very close to each other.

Figure 3:
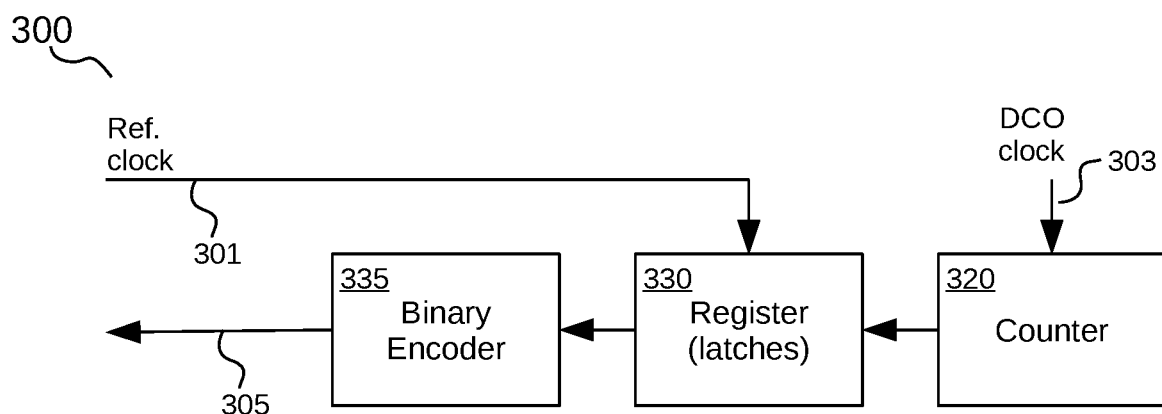
FIG. 3 illustrates a phase accumulator with reduced counter errors according to an embodiment of the invention.

FIG. 3 illustrates a phase accumulator 300 with reduced counter errors according to an embodiment of the invention. It includes counter 320, register 330 (that may include latches), and binary encoder 335. It solves or almost fully eliminates the problem described above with reference to FIG. 2 that occurs when counter 320 bits do not all respond equally fast, or bits of register 330 do not all respond equally fast. Counter 320 features an output sequence that changes only one bit per count. An example of such a sequence is the Gray code, so counter 320 may include a Gray counter. Since instead of potentially all bits only one bit changes, the chance of an error is much reduced. Moreover, if a one-bit change is not captured by register 330, then the error is never more than one count, and it is always in the same direction. Generally the design of the remainder of the PLL may not be based on such a code but, for example, on a simple binary code, and therefore phase accumulator 300 may comprise binary encoder 335, which converts the code used in counter 320 to the code used by relevant other parts of the PLL. For example, if counter 320 includes a Gray counter, then binary encoder 335 may include a Gray-to-binary converter. Some embodiments of a PLL that includes phase accumulator 300 may further provide for detection and correction of the error.

FIG. 4 illustrates an example sequence 400 with one bit change per count according to an embodiment of the invention. The example sequence 400 is not a Gray code. It is simple to implement with a bit valued "1" that ripples from the right (least significant bit side) to the left (most significant bit side) until it bumps against a most significant bit, or against another bit valued "1". When all entries are filled with "1"s, the most significant bit toggles, and the sequence unwinds in reverse. The reverse second half of the sequence guarantees that the one-bit change per count is maintained when it is implemented in a modulo-K counter. If example sequence 400 is implemented in a modulo-K counter, its K-value is 48, and in the transition from count 47 to count 0, only the most significant bit toggles.

Although the example sequence 400 has a K value that is lower than the limit of a binary or a Gray counter, and may therefore use more power than necessary, the redundancy can be used for error detection and correction. While example sequence 400 is shown with a width of 6 bits, this class of sequences can be implemented with any bit width. And although it is provided as an example where a bit valued "1" ripples, it can also be implemented as a sequence where a bit valued "0" ripples. Or it can be implemented as a sequence where bits ripple from the left to the right. The example shown has bits alternatingly rippling by themselves or in a group of 2. In other implementations, other group sizes are possible.

Figure 5:
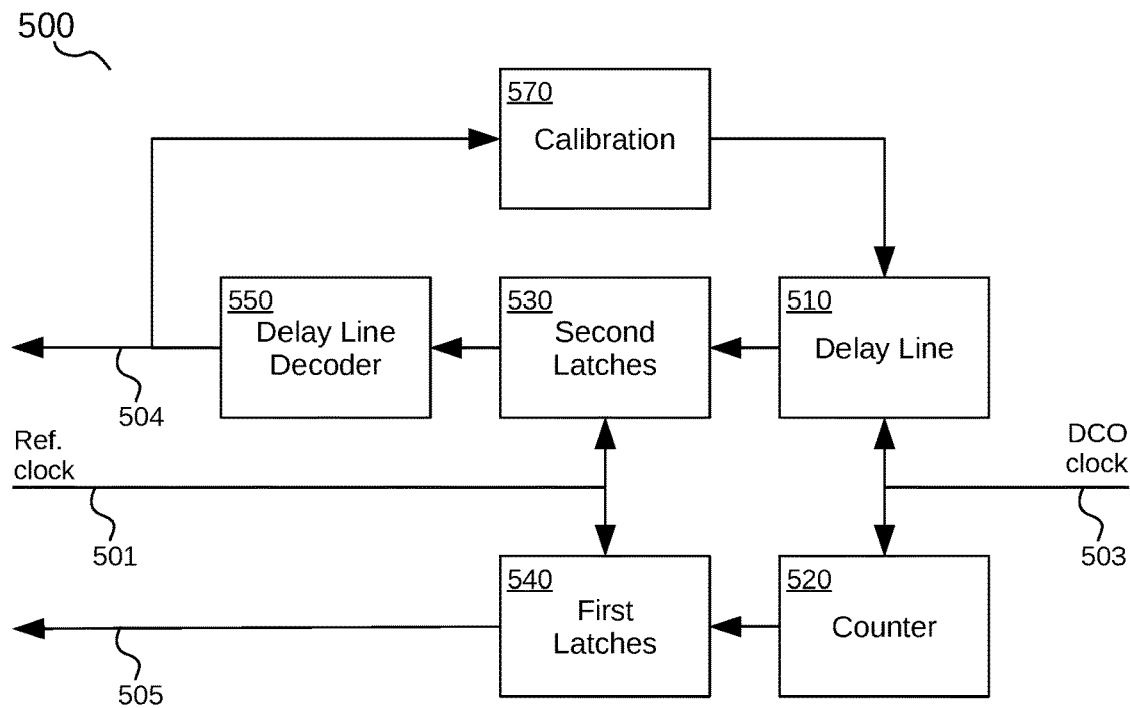
FIG. 5 illustrates a phase accumulator according to an embodiment of the invention.

FIG. 5 illustrates a phase accumulator 500 according to an embodiment of the invention. Phase accumulator 500 includes delay line 510, counter 520, which may include a modulo-K counter, first latches 540, second latches 530, delay line decoder 550, and optional calibrator 570. A controlled-oscillator clock signal 503 triggers both delay line 510 and counter 520, whereas reference clock signal 501 triggers both second latches 530 and first latches 540. Second latches 530 and first latches 540 fulfill the function of register 130 in FIG. 1.

When phase accumulator 500 receives a controlled-oscillator clock signal 503 pulse, counter 520 increments, and the pulse starts propagating through delay line 510. The delay line 510 has a number of stages, whose average delay determines its resolution, and a time range that is longer than the longest duration of a controlled-oscillator clock signal 503 cycle. It includes multiple output taps, matching the number of stages, and the output taps are coupled to second latches 530. When a pulse propagates through delay line 510, the pulse also propagates along its multiple output taps. Counter 520 counts cycles of controlled-oscillator clock signal 503, extending the time range of phase accumulator 500 to its maximum value (K−1 in the case of a modulo-K counter) times the shortest duration of a controlled-oscillator clock signal 503 cycle. Counter 520 has multiple output bits (e.g., $^2\log K$), that are coupled to first latches 540. When phase accumulator 500 receives a reference clock signal 501 pulse, second latches 530 sample the multiple delay line 510 output taps, and first latches 540 sample the counter 520 output bits. Thus, the output state of second latches 530 freezes a state of propagation of the most recent controlled-oscillator clock signal 503 pulse at the time of receiving the reference clock signal 501 pulse, and first latches 540 freezes a number of controlled-oscillator clock signal 503 pulses received by counter 520. The first latches 540 output signal includes a code produced by counter 520 that signifies an integer part of a controlled-oscillator clock signal 503 measured phase, the integer output phase 505. The second latches 530 output signal includes a series of successive equal bit values (1s or 0s) of which the front signifies the fractional progress of the most recent controlled-oscillator clock signal 503 pulse. The delay line decoder 550 converts this to a binary number representing the fractional output phase 504. Delay line decoder 550 may be implemented with, for example, combinatorial logic or a memory that includes a lookup-table.

Embodiments forward fractional output phase 504 to optional calibrator 570, which may perform a calibration at, e.g., startup after controlled-oscillator clock signal 503 has initially stabilized, to set a required target number of delay line steps per controlled-oscillator clock signal 503 pulse. Optional calibrator 570 may further perform a background calibration during phase accumulator 500 operation to keep the required number of delay line steps per controlled-oscillator clock signal 503 pulse stable regardless of changes in operating conditions such as temperature and supply voltage. Optional calibrator 570 may do so by repeatedly measuring the actual number of delay line steps per controlled-oscillator clock signal 503 pulse and averaging the results to obtain an accurate number. Optional calibrator 570 may form a negative feedback loop with delay line 510, second latches 530, and delay line decoder 550 that keeps the average actual number of delay line steps per controlled-oscillator clock signal 503 pulse equal to the required actual number of delay line steps per controlled-oscillator clock signal 503 pulse.

Figure 6A:
FIGS. 6A-C illustrate additional error sources in the phase accumulator of FIG. 5.
Figure 6B:
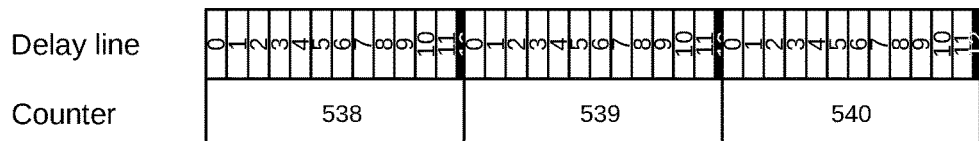
Figure 6C:
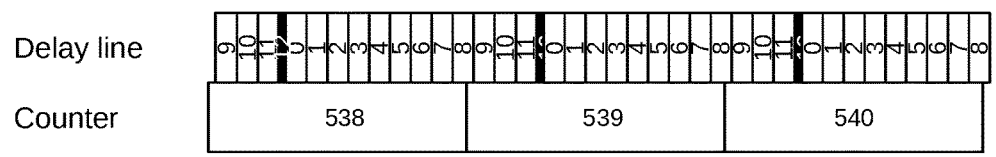

FIGS. 6A-C illustrate additional error sources in the phase accumulator of FIG. 5. FIG. 6A shows an example of correct alignment between delay line 510 and counter 520. Each controlled-oscillator clock signal 503 cycle (538, 539, 540, . . . ) ripples through exactly 13 stages (0-12) of delay line 510. The response of delay line 510 is fully aligned with the counter 520 response. However, since the resolution of the delay line is determined by its design, the IC manufacturing technology, process variations, the temperature, and the applied voltage, whereas the controlled-oscillator clock signal 503 cycle time may be dependent on unrelated factors, it is generally not easy to guarantee an exact predetermined number of delay line 510 steps per controlled-oscillator clock signal 503 cycle (unless an embodiment includes optional calibrator 570). FIG. 6B shows that in practical situations the number of delay line 510 steps per controlled-oscillator clock signal 503 cycle may not be an integer. In this example, step 12 is a partial step. FIG. 6C shows that delay line 510 and counter 520 may not be aligned either. Generally, delay line 510 will have an offset in time, meaning that delay line 510 will respond to a controlled-oscillator clock signal 503 cycle earlier or later than counter 520. As explained in U.S. Pat. No. 9,484,889, "Delay Fabric Apparatus and Delay Line", by Julian Jenkins, this offset can be intentional to improve linearity.

Figure 7:
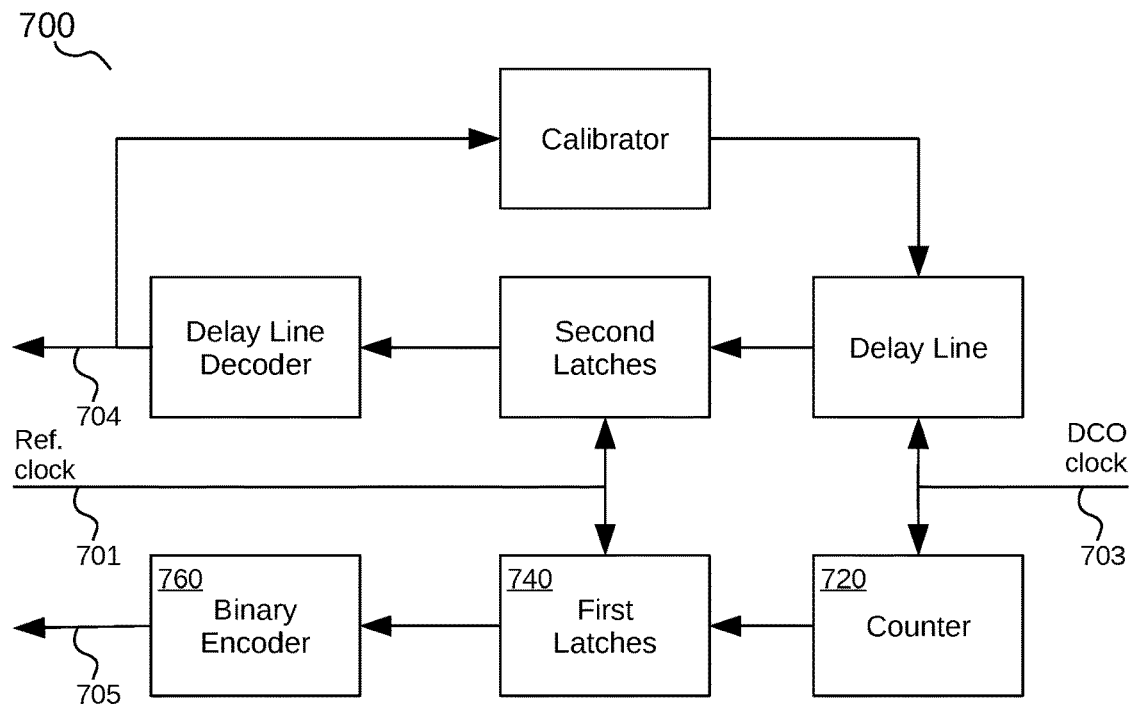
FIG. 7 illustrates a phase accumulator combining the features of FIGS. 3 and 5 according to an embodiment of the invention.

FIG. 7 illustrates a phase accumulator 700 combining the features of FIGS. 3 and 5 according to an embodiment of the invention. Phase accumulator 700 includes counter 720 which features an output sequence changes only one bit per count. It includes a delay line, first latches, a delay line decoder, first latches 740, binary encoder 760, and a calibrator. Phase accumulator 700 receives reference clock signal 701 and controlled-oscillator clock signal 703. It outputs integer part 705 and fractional part 704 of the measured phase. The sequence of counter 720, first latches 740, and binary encoder 760 ensures that the integer part 705 of the measure phase is never off by more than one count. The calibrator ensures that the number of fractional steps per controlled oscillator cycle is correct.

Figure 8:
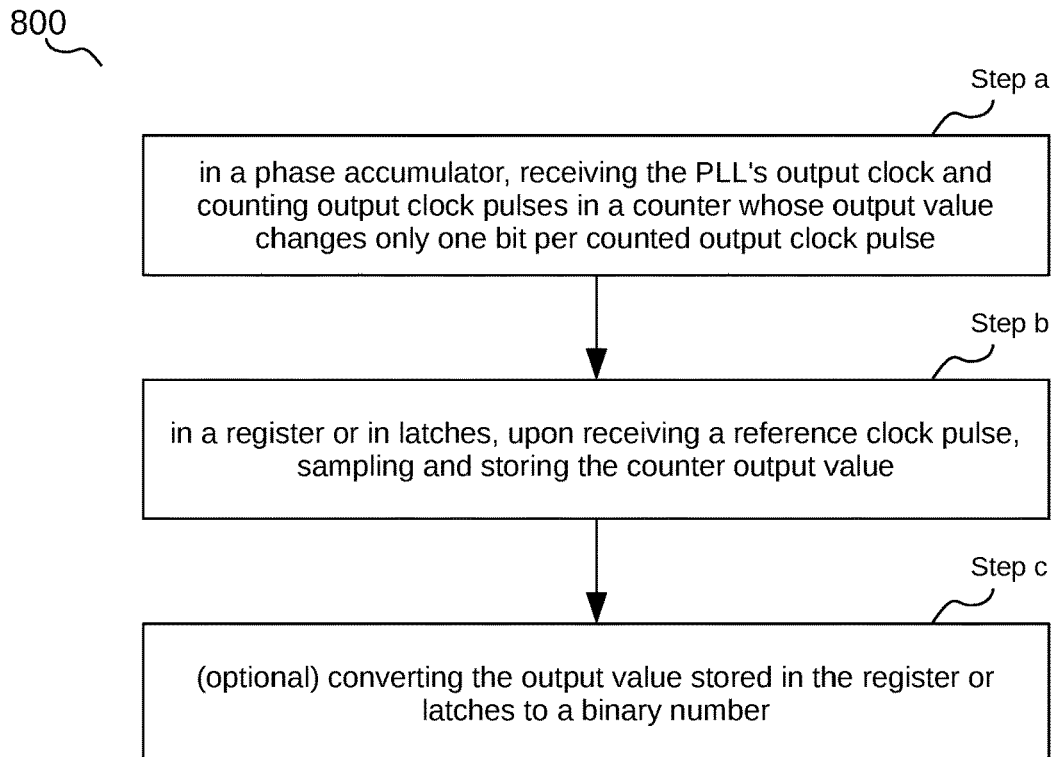
FIG. 8 illustrates a method to measure a PLL's output clock phase with improved accuracy.

FIG. 8 illustrates a method 800 to measure a PLL's output clock phase with improved accuracy. The method includes the following steps:

Step a—in a phase accumulator, receiving the PLL's output clock and counting output clock pulses in a counter whose output value changes only one bit per counted output clock pulse. The counter may, for example, be or include a Gray counter.

Step b—in a register or in latches, upon receiving a reference clock pulse, sampling and storing the counter output value.

Step c—(optional) converting the output value stored in the register or latches to a binary number.

Power-Saving Phase Accumulator

Figure 9:
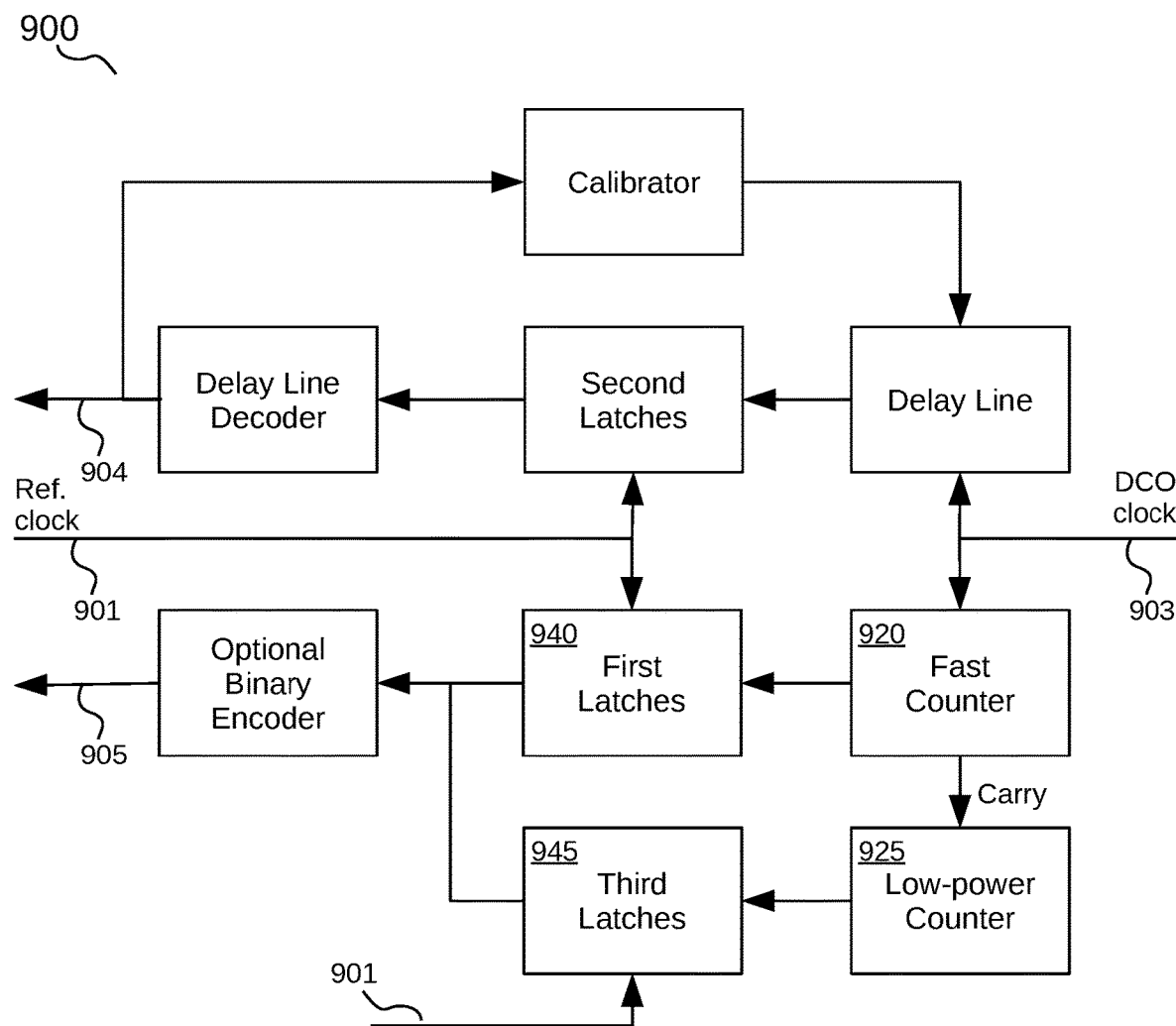
FIG. 9 illustrates detail of a power-saving phase accumulator according to an embodiment of the invention.

FIG. 9 illustrates detail of a power-saving phase accumulator 900 according to an embodiment of the invention. Since counter 520 in FIG. 5 needs to be very fast, it may consume much power. FIG. 9 shows that it can be split in a fast counter 920 and a low-power counter 925. Similarly, the first latches 540 of FIG. 5 is split in first latches 940 and third latches 945. The fast counter 920 is triggered by clock signal 903, which may come from a controlled oscillator, whereas the low-power counter 925 is triggered by the fast counter 920 carry signal. Therefore, the fast counter 920 output value represents one or more least significant bits of the integer clock phase 905, whereas the low-power counter 925 output value represents the remaining one or more most significant bits of the integer clock phase 905. Both first latches 940 and third latches 945 are triggered by reference clock signal 901. From the discussion around FIG. 2 it is clear that this may lead to errors, especially when a reference clock signal 901 occurs right after a carry signal from fast counter 920 to low-power counter 925, and before low-power counter 925 has been able to change its output signal. However, this error can be corrected in optional binary encoder 960 if fast counter 920 and/or low-power counter 925 change no more than one bit per count. If only fast counter 920 but not low-power counter 925 changes no more than one bit per count, optional binary encoder 960 may be concatenated with first latches 940, but not with third latches 945, and vice versa. Yet another embodiment could use two different such sequences for fast counter 920 and low-power counter 925, in which case first latches 940 would have a first binary encoder, and third latches 945 would have a second binary encoder.

Splitting the counter and latches into fast and low-power circuits has the advantage that the most significant bits in a phase count, in the split counter, consume much less power than least significant bits in the phase count. For example, if the fast counter 920 is one bit wide, bits in low-power counter 925 can theoretically save up to 50% energy for each time they switch. However, they would switch relatively often, and more energy may be saved by making fast counter 920 two bits wide (increasing its power consumption by 50%), which would make low-power counter 925 bits theoretically save up to 75% energy for each time they switch, and they switch 75% less often. Of course, the energy savings may not match the theoretical maximum. A designer can find an optimum split between the number of bits for fast counter 920 and low-power counter 925 by taking all relevant factors into account, and/or simulating candidate configurations.

Power-saving phase accumulator 900 may further include a delay line, second latches, and a delay line decoder, which all operate similar to delay line 510, second latches 530, and delay line decoder 550 to produce a fractional clock phase 904 signal.

PLL with Beat-Frequency Operation

In prior-art PLLs great care was taken to ensure that they had a single frequency lock range (FLR), covering the full DCO frequency range. Whatever a DCO frequency was prior to locking, given a reference clock signal in an allowed range, and a frequency control word (FCW), the PLL's loop would force the DCO frequency to become the FCW times the reference clock signal frequency. Therefore, in prior-art PLLs, the phase accumulator and a phase predictor range were chosen to be large enough to capture at least twice a PLL's multiplication factor range, i.e., $K > 2R_N$, where $R_N = f_{DCO\_MAX}/f_{REF\_MIN}$. For example, to be able to multiply a minimum reference frequency $f_{REF\_MIN}$ of 0.5 MHz to a maximum DCO frequency $f_{DCO\_MAX}$ of 1.024 GHz (i.e., $R_N = 2048$), at least a 12-bit counter ($K = 2^{12} = 4096$) was used. During one cycle of a 0.5 MHz reference clock, the counter would count 2,048 cycles of a 1.024 GHz DCO clock, and the counter would show an output value at half its maximum value. If the DCO wasn't in lock yet, the counter could show a value as low as 0, corresponding to a DCO frequency that is lower than the 0.5 MHz reference clock frequency, and it could show a value as high as 4,095, corresponding to an (out-of-range) DCO frequency of 4.095 GHz.

Had K been chosen to be smaller than $R_N$, the PLL could also lock to DCO frequencies higher than FCW*$f_{REF}$. For example, if the above PLL with $R_N$=2048 had an 8-bit counter (K=256), its highest FCW would be 255 (i.e., K−1). With a 0.5 MHz reference clock and an FCW=255 it could lock to 127.5, 255.5, 383.5, 511.5, 639.5, 767.5, 895.5, and 1023.5 MHz. It would have eight separate FLRs, and the DCO could come to lock in each one, dependent on its prior state. Every 128 MHz there would be a so-called "beat frequency" to which the DCO could lock. Beat frequencies are spaced K times the reference frequency apart (see analysis below, with reference to FIG. 10). Locking to a beat frequency was considered undesirable. But embodiments of the present invention use this behavior to their advantage for saving power. A modulo-K counter and register (second latches) in a phase accumulator are very high-speed circuits. High speed comes at the cost of high power usage, and reducing the bit widths of the modulo-K counter, second latches, phase predictor and phase subtractor saves power.

Figure 10:
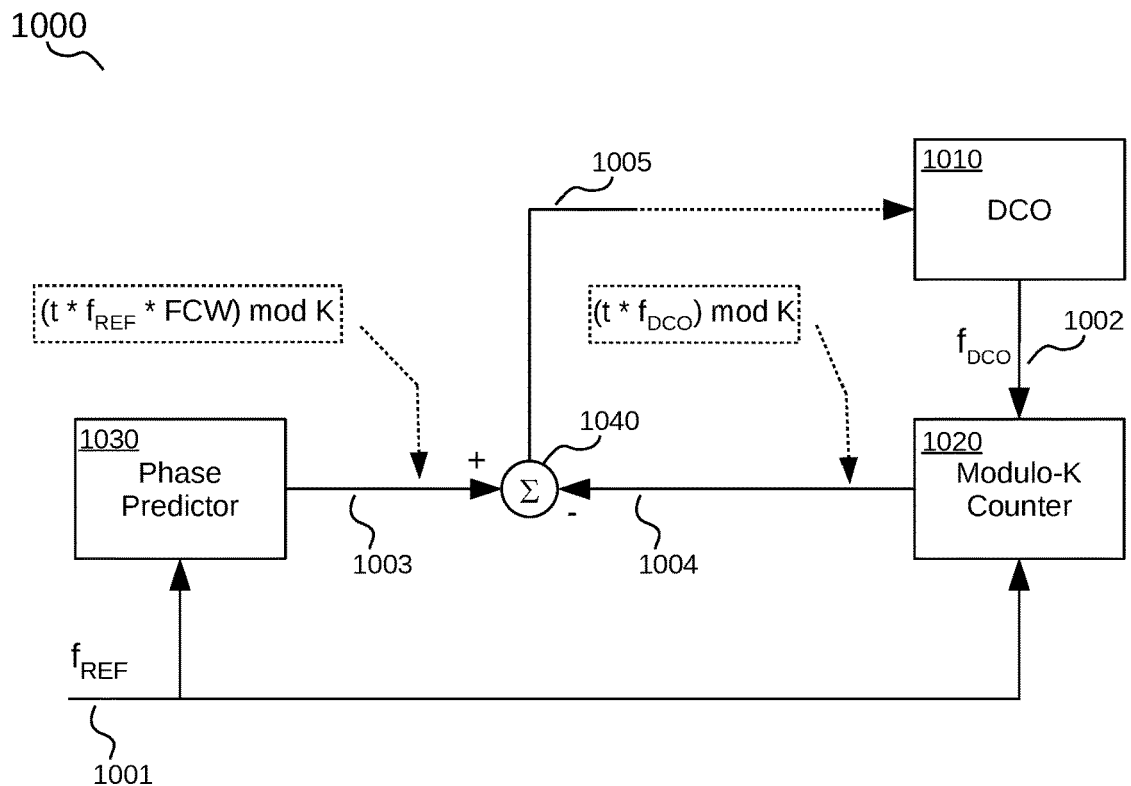
FIG. 10 illustrates an analysis of beat frequency locking according to an embodiment of the invention.

FIG. 10 illustrates an analysis of beat frequency locking according to an embodiment of the invention. FIG. 10 shows a simplified diagram of a PLL 1000 that is in lock. The analysis is equally valid for an integer-N and a fractional-N PLL. The diagram leaves out anything that is not relevant for the analysis, including the loop filter. PLL 1000 includes DCO 1010, modulo-K counter 1020, phase predictor 1030, and phase subtractor 1040. DCO 1010 generates a DCO output signal 1002 with frequency $f_{DCO}$, which it forwards to modulo-K counter 1020. Modulo-K counter 1020 counts cycles of DCO output signal 1002, whose values are sampled at each cycle of reference clock signal 1001, which has a frequency $f_{REF}$. The modulo-K counter 1020 output signal represents a measured phase 1004. Phase predictor 1030 has a predicted phase 1003 output signal, whose value is updated at each cycle of reference clock signal 1001. Since PLL 1000 is in lock, the predicted phase 1003 and measured phase 1004 are equal, and phase difference 1005 equals zero. The predicted phase 1003 has a value (t*$f_{REF}$*FCW) mod K, in which t stands for the time (this analysis ignores any noise shaping in predicted phase 1003). The product t*$f_{REF}$ represents the accumulated number of reference clock signal 1001 cycles over the time t. This is multiplied by the FCW to get predicted phase 1003, and the result is presented modulo-K to match the output format of modulo-K counter 1020. The measured phase 1004 has a value of (t*$f_{DCO}$) mod K. Here, t*$f_{DCO}$ represents the accumulated number of DCO output signal 1002 cycles over the time t.

Since predicted phase 1003 and measured phase 1004 are equal, (t*$f_{REF}$*FCW) mod K=(t*$f_{DCO}$) mod K. This should be valid for any time t, including for the first time $t_1$ that modulo-K counter 1020 and phase predictor 1030 are sampled by reference clock signal 1001, i.e., $t_1$=1/$f_{REF}$. The left-hand side mod K can be ignored, because it only maps higher frequencies onto $f_{REF}$. The right-hand side mod K can be rewritten as −(li−1)*K with li∈{1, 2, . . . }, so that the formula becomes: FCW=($f_{DCO}$/$f_{REF}$)−(li−1)*K. Rearranged, the multiplication factor N becomes:

$$N = f_{DCO}/f_{REF} = FCW + (li-1)*K \text{ with } li \in \{1, 2, \ldots\}.$$

As expected, the fundamental lock frequency for $f_{DCO}$ is at FCW*$f_{REF}$. Beat frequencies occur above that at equally spaced K*$f_{REF}$ intervals.

A perspective less dependent on formulas is as follows. If the maximum counter value (e.g., K−1) is reached at the maximum DCO frequency ($f_{DCO\_MAX}$) during one cycle of the minimum reference frequency (K=$R_N$), and the DCO has an ideal frequency range from 0 to $f_{DCO\_MAX}$, then there is only one DCO frequency for which measured phase 1004 could match predicted phase 1003, and it equals FCW*$f_{REF}$. However, if $R_N$ is larger than K, say n times as large, then modulo-K counter 1020 will loop n times during the one cycle of the minimum reference frequency to count the $R_N$ cycles of DCO 1010 running at its maximum frequency. However, this implies that there are n different frequencies where the measured phase 1004 will match the predicted phase 1003, and PLL 1000 could lock to any of those frequencies. The DCO 1010 ideal frequency range from 0 to $f_{DCO\_MAX}$ is divided into n separate FLRs, each of which has exactly one match for a selected FCW. The size of each FLR is $f_{DCO\_MAX}$/n, and it also equals K*$f_{REF}$. The value of $f_{DCO\_MAX}$ may not be tightly controllable, since it may be dependent on manufacturing variations, the temperature, and the DCO 1010 power supply (voltage or current), and therefore n and $R_N$ are not known accurately. However, embodiments are in full control of K, and the choice of the index li for selecting a correct FLR.

A FLR with index li starts at:

$$f_{FLR\_MIN}(li) = (li-1)*K*f_{REF}$$

It ends at:

$$f_{FLR\_MAX}(li) = li*K*f_{REF}$$

Target DCO frequency within the range:

$$f_{DCO\_TARGET}(li) = (li-1)*K*f_{REF} + FCW*f_{REF}$$

PLLs do not usually have an ideal frequency range from 0 to $f_{DCO\_MAX}$. One reason is the difficulty of designing a DCO with such a wide range. Instead, a DCO may have a range of just over an octave or part of an octave (one octave means that the minimum DCO frequency is half the maximum DCO frequency). If the range is one octave, then an application can obtain any lower frequency by using an output divider. If DCO 1010 has a frequency range of ½ $f_{DCO\_MAX}$ to $f_{DCO\_MAX}$, for K=$R_N$/2 (i.e., n=2), there will be only 2 separate FLRs. The first one, for the fundamental lock frequency (li=1), is unavailable because it is below ½ $f_{DCO\_MAX}$. The second one, with the first beat frequency (li=2), is available because it fully covers the DCO frequency range.

Figure 11:
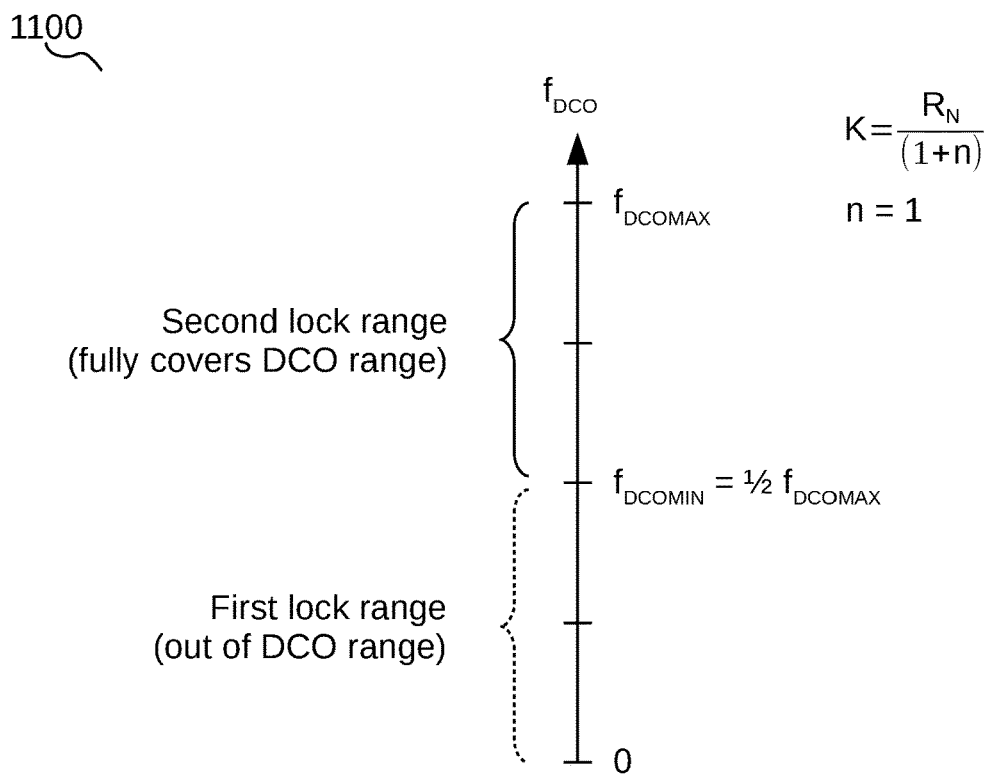
FIG. 11 shows an analysis of a one-octave DCO frequency range and its frequency lock ranges based on $K=R_N/2$ according to an embodiment of the invention.

FIG. 11 shows an analysis of a one-octave DCO frequency range and its FLRs based on K=$R_N$/2 according to an embodiment of the invention. The vertical arrow represents a linear frequency spectrum 1100, starting at 0 Hz (at the bottom) and going to the maximum DCO output frequency $f_{DCOMAX}$ at the top. The minimum DCO output frequency $f_{DCOMIN}$ is an octave lower, so at ½ $f_{DCOMAX}$. Since n=2, there are two FLRs, each with a size of ½ $f_{DCOMAX}$. The first lock range is located between 0 and ½ $f_{DCOMAX}$, and the second lock range is located from ½ $f_{DCOMAX}$ to $f_{DCOMAX}$. The first lock range, associated with the fundamental frequency (li=1), is fully out of range of the DCO. However, the second lock range, associated with the first beat frequency (li=2), fully covers the DCO frequency range. Therefore, embodiments of the invention using a one-octave DCO can always safely use the first beat frequency. No matter what frequency the DCO may have in its one-octave range prior to achieving lock, when n=2 it will always lock to the first beat frequency. Similarly, a half-octave DCO with n=4 will always lock to the third beat frequency (li=4), and so on. Embodiments in which the DCO frequency range covers multiple FLRs must take care that a DCO frequency at the start of a lock-in period is already within the target frequency range, otherwise the embodiment could lock to a wrong beat frequency. They can do so in a few ways, for example: (1) achieving initial lock with a different mechanism, such as a frequency-lock loop; (2) achieving initial lock with a sufficiently high K, and decreasing K once initial lock has been achieved; (3) narrowing the DCO range prior to achieving lock; or (4) presetting the DCO at a frequency guaranteed to be in the desired FLR, for example at the DCO minimum, middle, or maximum frequency, prior to acquiring initial lock. A frequency-lock loop, for example, may comprise counters to measure the DCO frequency and the reference clock frequency, and a feedback loop to set the DCO frequency close to li*K+FCW times the reference clock frequency, with li>1. Presetting the DCO at a frequency guaranteed to be in the desired FLR may require preprogramming registers in the loop filter to provide a controlled DCO behavior at the start of a lock-in period.

Figures 12, 13:
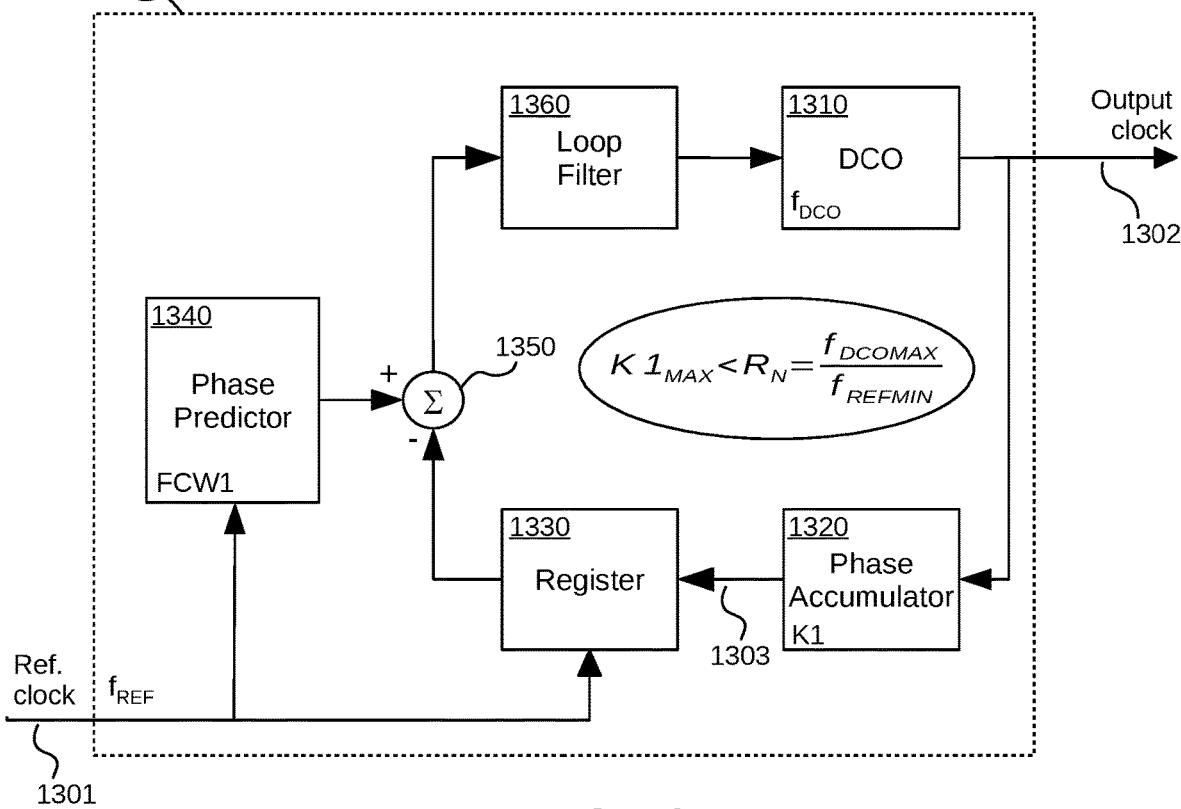
FIG. 12 shows a table with normalized frequency lock ranges versus selection of K according to an embodiment of the invention.
FIG. 13 illustrates a first beat-frequency PLL according to an embodiment of the invention.

FIG. 12 shows a table with normalized FLRs versus selection of K according to an embodiment of the invention. It shows how, for a PLL with $R_N$=2,048 and a normalized maximum DCO frequency of 1,000, the normalized FLR ("range") reduces with decreasing numbers of counter bits. At K=$R_N$=2,048, only the fundamental frequency can be used. There is only one lock range ("# bands") and its normalized size is 1,000. Reducing the number of counter bits, for example, to 5 (K reduces to 32), there are up to 64 FLRs for the fundamental and up to 63 beat frequencies, and each FLR has a normalized width of 15.6.

FIG. 13 shows a first beat-frequency PLL 1300 according to an embodiment of the invention. Some PLLs are designed for applications that require only a narrow, controlled oscillator frequency range and that also have a minimum reference frequency—sometimes dictated by an industry standard, or a jitter or phase noise requirement. For example, a PLL that locks to a crystal—including a jitter attenuator that locks to a crystal—may need to show a low-phase noise or low-jitter output signal. To prevent that a controlled oscillator that includes an LC tank becomes dominant for the phase noise or jitter, the loop filter cut-off frequency needs to be sufficiently high, and therefore the reference frequency needs to be sufficiently high, for example above 100 kHz or above 1 MHz. A beat-frequency PLL can save power, and may be as easy to operate as a regular PLL.

First beat-frequency PLL 1300 includes a controlled oscillator 1310 configured to generate an output clock signal 1302 with a maximum output clock frequency. It further includes phase accumulator 1320 comprising a modulo-K counter with an input receiving output clock signal 1302. The phase accumulator 1320 has a maximum K value. Phase accumulator 1320 outputs a measured phase signal 1303 that is sampled by register 1330 upon receiving an active edge of reference clock signal 1301 which has a minimum reference clock frequency. First beat-frequency PLL 1300 further includes phase predictor 1340 which is configured to calculate a required phase based on a FCW upon receiving an active edge of reference clock signal 1301, and phase comparator 1350 which calculates a phase difference by subtracting the sampled measured phase at the register 1330 output from the required phase. To generate an oscillator control signal, loop filter 1360 filters the phase difference. Phase accumulator 1320 and phase predictor 1340 have a range of output signals (the measured phase signal 1303 and the required phase) from 0 to K1−1, wherein K1 is the modulo-K value with the maximum K value. Unlike in conventional designs, first beat-frequency PLL 1300 has a maximum K value that is less than a multiplier range value defined as the ratio of the maximum output clock frequency over the minimum reference clock frequency. For example, the maximum K value may be half the multiplier range value. In some embodiments, controlled oscillator 1310 has a difference between the maximum output clock frequency and a minimum output clock frequency that is smaller than a frequency lock range (FLR) whose size equals K1 times the minimum reference clock frequency. In further embodiments, K1 can be modified and made smaller than the maximum K value.

First beat-frequency PLL 1300 may have a means for setting the output clock frequency in a target FLR prior to the first beat-frequency PLL achieving final lock. Whereas some embodiments have an output clock frequency range is fully included in a single frequency lock range (FLR) and are therefore guaranteed to lock to a desired frequency, in other embodiments the output clock frequency range spans multiple FLRs. One of these, the target FLR, includes the desired frequency. Should controlled oscillator 1310 oscillate in an FLR other than the target FLR during the lock-in period, then the first beat-frequency PLL 1300 will lock to an undesired beat frequency. To guarantee that first beat-frequency PLL 1300 locks to the desired frequency, it needs to set the output clock frequency in the target FLR prior to lock-in. Several means for achieving this have been discussed with reference to FIG. 11. They include (1) using a frequency-lock loop, which can be much faster than a regular PLL loop; (2) using a wider FLR spanning the full output clock frequency range during a provisional lock-in; (3) comparing the ratio of output clock frequency and reference frequency and using a binary search to determine an oscillator control code that yields the required multiplication factor prior to lock-in; and (4) presetting the controlled oscillator at a value known (by design) to be in the target FLR.

Figure 14:
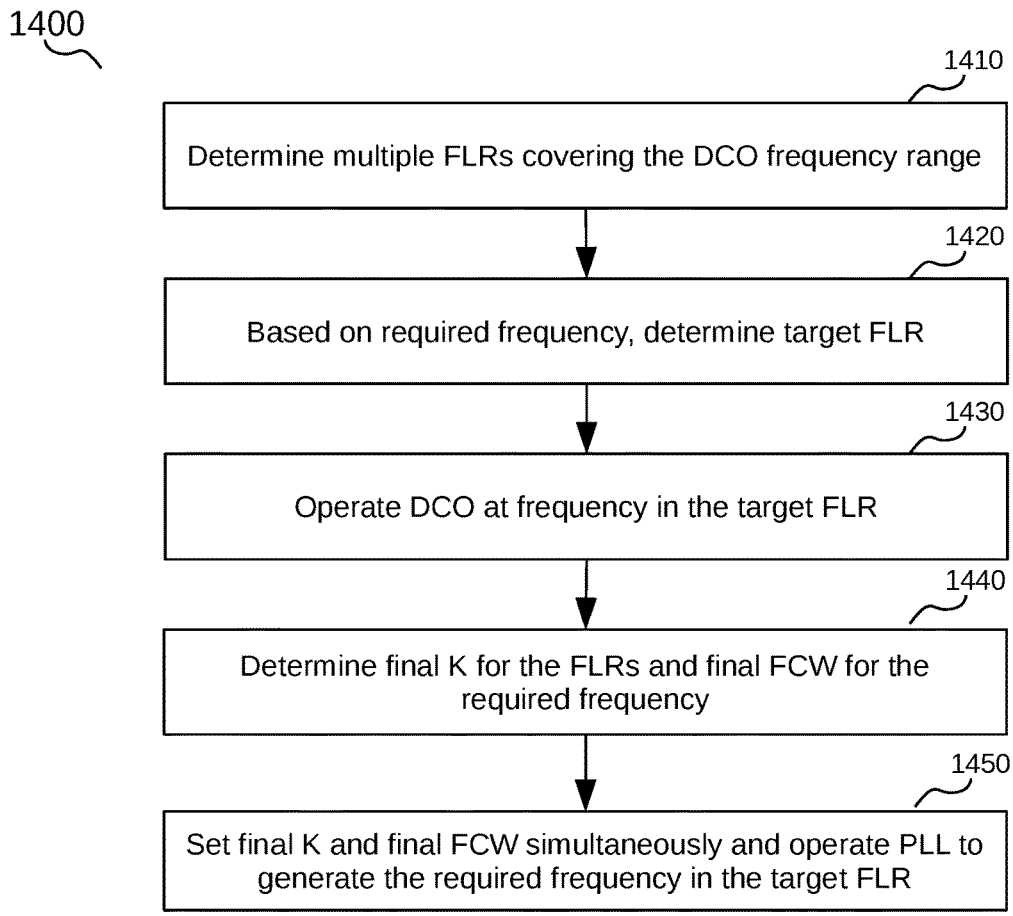
FIG. 14 illustrates a method for operating a beat-frequency PLL according to an embodiment of the invention.

FIG. 14 illustrates a method 1400 for operating a beat-frequency PLL according to an embodiment of the invention. Method 1400 includes the following steps.

Step 1410—Determining multiple FLRs covering a controlled oscillator frequency range. An embodiment can save power by lowering the ranges of the beat-frequency PLL phase accumulator, register, phase predictor, and phase subtractor. Lowering the ranges may result in increasing the number of FLRs. Although the beat-frequency PLL could achieve lock in each of the multiple FLRs, it will only lock to a frequency in an FLR within which the controlled oscillator is already operating.

Step 1420—Based on a required frequency, determining a target FLR. The target FLR is one of the multiple FLRs and the target FLR includes the required frequency. Therefore, this method step comprises determining which one of the multiple FLRs includes the required frequency.

Step 1430—Operating the controlled oscillator at a frequency in the target FLR. Method 1400 prepares the controlled oscillator to oscillate near or at the required frequency before its final settings are in effect. The controlled oscillator frequency needs to be in the same FLR as the required frequency. One method of operating the controlled oscillator near the required frequency (i.e., in the target FLR) is by presetting the controlled oscillator, for example at its highest frequency, at its lowest frequency, in the middle of its range, or at any other frequency known to be in the target FLR. This method is convenient when the number of final FLRs is low and each final FLR has a large bandwidth. Another method to operate the controlled oscillator in the target FLR will be described with reference to FIG. 15.

Step 1440—Determining a final K-value related to the multiple FLRs and a final FCW to generate the required frequency in the target FLR.

Step 1450—Setting the final K-value and the final FCW and operating the beat-frequency PLL to generate the required frequency in the target FLR.

Figure 15:
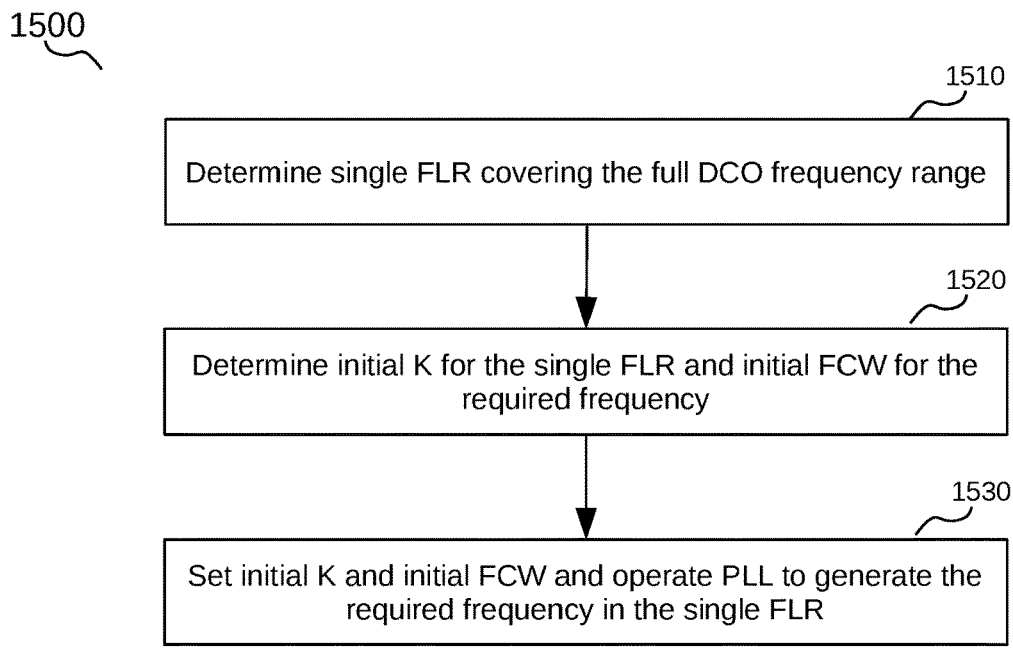
FIG. 15 illustrates a method for operating a beat-frequency PLL near or at a required frequency according to an embodiment of the invention.

FIG. 15 illustrates a method 1500 for operating a beat-frequency PLL at a required frequency (i.e., in a target FLR) according to an embodiment of the invention. Method 1500 includes the following steps.

Step 1510—Determining a single FLR covering the full controlled oscillator frequency range. By having the full controlled oscillator frequency range covered by the single FLR, the embodiment guarantees that the controlled oscillator will be able to lock to only the required frequency.

Step 1520—Determining an initial K-value related to the single FLR and an initial FCW to generate the required frequency in the single FLR.

Step 1530—Setting the initial K-value and the initial FCW and operating the beat-frequency PLL to generate the required frequency in the single FLR.

An example of applying the above methods for setting a beat frequency PLL is as follows. Suppose the beat frequency PLL receives a reference frequency of 1 MHz and has a required output frequency of 539 MHz, so the required multiplication factor N=539. Suppose further that the beat frequency PLL has a DCO frequency range of 500 MHz to 1 GHz, and a minimum acceptable reference frequency of 0.5 MHz, so its $R_N$=2,000. Because it has a one-octave DCO, it supports K up to about ½ $R_N$, i.e. the maximum value of K is 1024, and the widths of its phase accumulator's modulo-K counter, second latches, phase predictor, and phase subtractor are all up to 10 bits in support of a maximum K of 1024. Suppose that power savings analysis has shown that the most power can be saved with a K of 4, then the beat frequency PLL supports a minimum K of 4, i.e. the bit widths all reduce to 2 bits.

The beat frequency PLL is set to acquire initial lock first. Since the reference frequency is 1 MHz, an embodiment can reduce K to 512, maintaining n=2. The beat frequency PLL uses only 9 of the 10 bits in the phase accumulator, phase predictor, and phase subtractor. To achieve a multiplication factor N=539, it programs the FCW at 27. Since it uses the first beat frequency (li=2), N=FCW+(li−1)*K=27+(2−1)*512=539. Using these settings, the beat frequency PLL achieves initial lock and the DCO settles at a frequency of 539 MHz. Now that the DCO is at the right frequency, it is possible to use a much narrower FLR, and reduce K further. Since most power is saved with K=4, the embodiment reduces K from 512 to 4, reducing bit widths from 9 bits to 2 bits. It also changes the FCW to maintain N at 539. The new FCW is 3. The embodiment uses the 134$^{th}$ beat frequency (li=135), so that N=3+134*4=539. The FLR is reduced from the initial 500 MHz (calculated from (K=) 512*($f_{REF}$=) 1 MHz) to 4 MHz (calculated from (K=) 4*($f_{REF}$=) 1 MHz).

The K value may or may not be a factor of 2. For example, a counter presenting the sequence in FIG. 4 has a K value of 48, which is not a factor of 2. However, a binary counter may have a width of b bits, and a K value of $2^b$ (two to the power of b). In this special case, while a new K is derived from the previous K by limiting the modulo-K counter bit width, a new FCW can be derived from the previous K by limiting its bit width and effectively masking its most significant bits. For example, in binary code, 539 reads as 010 0001 1011. Reducing the bit width from 11 to 2 reduces the binary code to 11, i.e. 3 as a decimal number.

Figure 16:
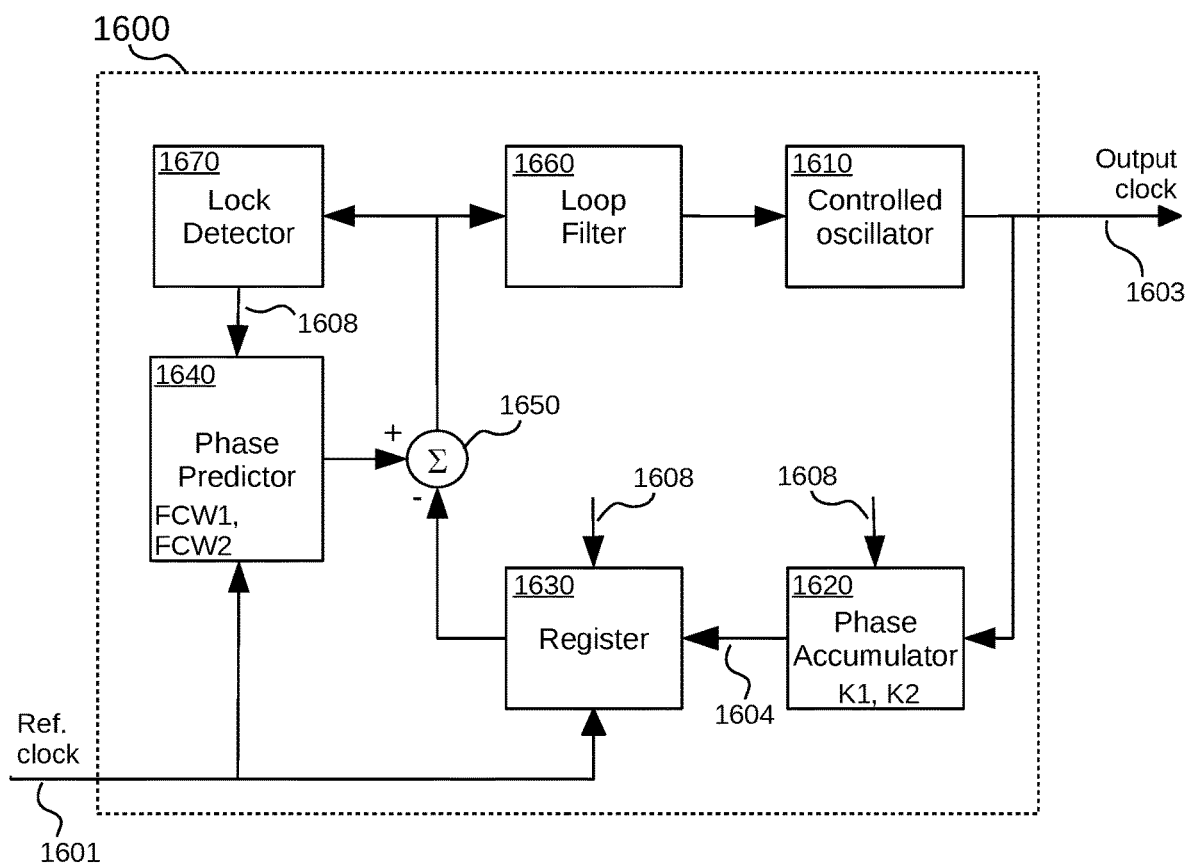
FIG. 16 illustrates a second beat-frequency PLL according to an embodiment of the invention.

FIG. 16 illustrates a second beat-frequency PLL 1600 according to an embodiment of the invention. It comprises controlled oscillator 1610, phase accumulator 1620, register 1630, phase predictor 1640, phase comparator 1650, loop filter 1660, and lock detector 1670 configured to provide phase lock indicator signal 1608. In some embodiments, lock detector 1670 has an input coupled with a phase comparator 1650 output, as drawn. In other embodiments, lock detector 1670 may receive an input signal from elsewhere, such as from phase accumulator 1620. Register 1630 and phase predictor 1640 have inputs coupled with a reference clock signal 1601 input, and controlled oscillator 1610 provides an output clock signal 1603 to phase accumulator 1620. Controlled oscillator 1610 has an output clock frequency within a frequency range. Phase accumulator 1620 includes a modulo-K counter, which is configured for receiving output clock signal 1603 and counting output clock signal 1603 cycles up to a maximum modulo-K counter K−1 value at which it restarts counting at 0. The modulo-K counter is configured to switch from a first K value (K1) related to a first bit width to a second K value (K2) related to a second bit width at a start of a modulo-K cycle when the phase lock indicator signal 1608 indicates that the output clock frequency is within a target FLR, and from the second K value to the first K value at the start of a modulo-K cycle when the phase lock indicator signal 1608 indicates that the output clock frequency is not within the target FLR. Modulo-K counter provides an output phase count value 1604 to register 1630, which samples it upon receiving a reference clock signal 1601 pulse and stores a measured phase count value and provides it at its output until it receives another reference clock signal 1601 pulse and updates it. Register 1630 is configured to switch between the first bit width and the second bit width simultaneously with the modulo-K counter switching between the first K value and the second K value. Phase predictor 1640, upon receiving a reference clock signal 1601 pulse, calculates a predicted phase count value, which includes a number of reference clock signal 1601 cycles multiplied by a FCW. Phase predictor 1640 is configured to switch between a first FCW, the first K value, the first bit width and a second FCW, the second K value, and the second bit width simultaneously with the modulo-K counter switching between the first K value and the second K value. Phase comparator 1650 calculates a phase difference by subtracting measured phase count value from predicted phase count value. Loop filter 1660 receives phase difference and filters it to provide an oscillator control code to controlled oscillator 1610.

In some embodiments, the modulo-K counter K−1 value can be increased or decreased. Further embodiments may also change a bit width of phase comparator 1650. Even further embodiments may change the modulo-K counter K−1 value and the register 1630 bit width by splitting the modulo-K counter in two or more separate counters with different speed grades and splitting register 1630 in two or more registers with different speed grades (as discussed with reference to FIG. 9) and switching off or on the slower blocks.

In some embodiments, lock detector 1670 receives the phase difference and determines if successive values of phase difference are within a narrow band around zero to indicate the second beat-frequency PLL 1600 is in phase lock, and upon determining that second beat-frequency PLL 1600 is in phase lock, it asserts phase lock indicator signal 1608. In further embodiments, phase lock indicator signal 1608 includes a measure of phase lock tightness which the embodiments use to adjust the modulo-K counter K−1 value.

Other embodiments may use different methods of lock detection. For example, they may check on the presence of a reference clock signal 1601 pulse during a short period that such a reference clock signal 1601 pulse is expected. Or they may use a delta-frequency predictor signal to indicate lock or loss of lock.

PLL with Lock-in Frequency Controller

Figure 17:
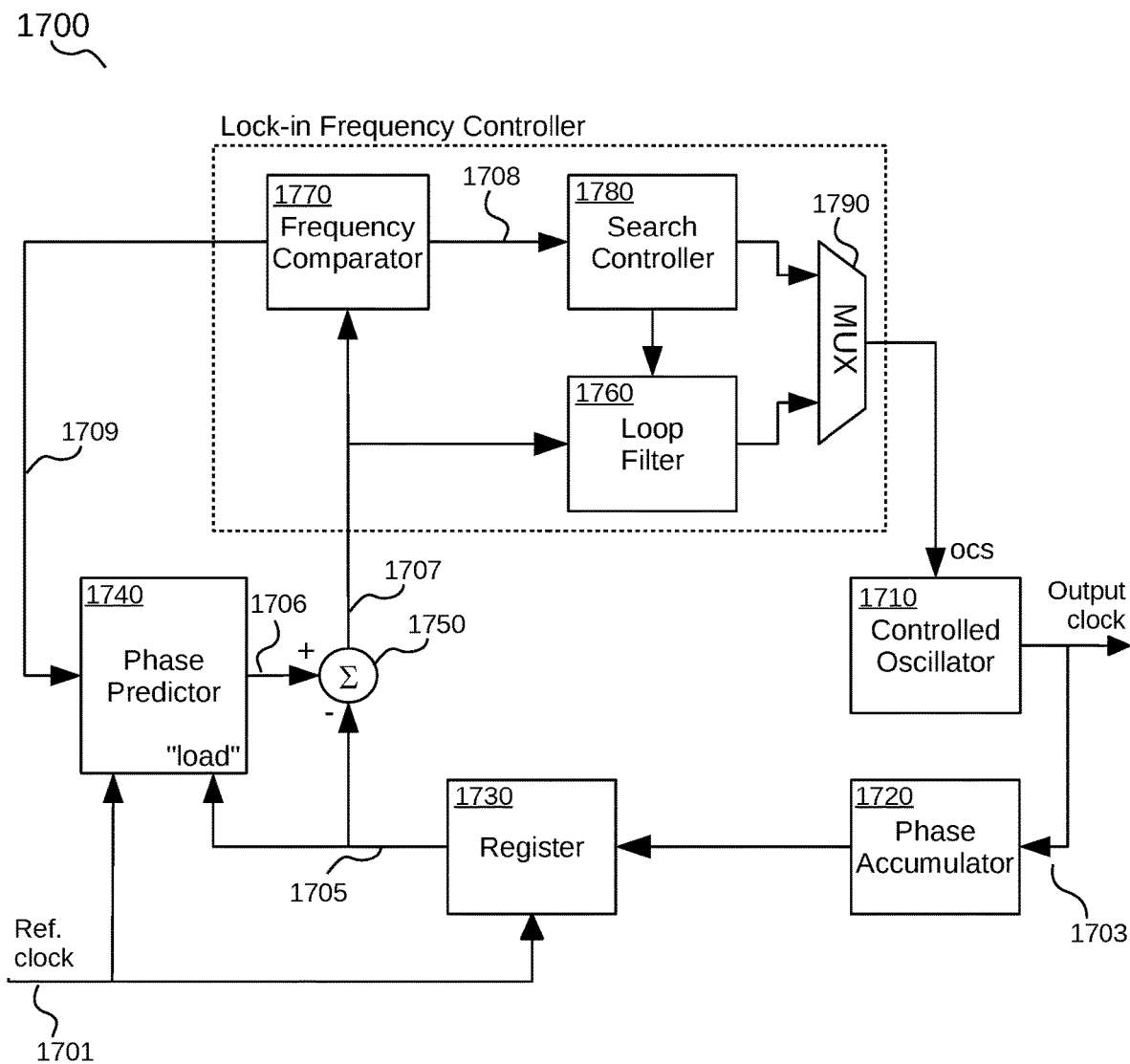
FIG. 17 illustrates a PLL with a frequency comparator according to an embodiment of the invention.

FIG. 17 illustrates a PLL 1700 with a frequency comparator 1770 according to an embodiment of the invention. PLL 1700 further includes controlled oscillator 1710, phase accumulator 1720, register 1730 (which in some embodiments is included in phase accumulator 1720), phase predictor 1740, phase subtractor 1750, loop filter 1760, search controller 1780 and multiplexer 1790. Some embodiments may implement frequency comparator 1770, loop filter 1760, search controller 1780 and multiplexer 1790 as a single block, for example in the form of a digital processor dedicated to frequency processing and control. PLL 1700 is configured to receive a reference clock signal 1701 and to deliver an output clock signal 1703.

At startup or any other time when PLL 1700 is not in lock, signals in the loop may have random or default startup values, or values based on prior conditions that are no longer valid or relevant. Therefore, it may be expected that controlled oscillator 1710 will oscillate at an oscillator frequency far different from a target frequency based on the reference clock signal 1701 and a configured FCW. During a lock-in period, embodiments search for a controlled oscillator 1710 oscillator control signal (ocs) that makes controlled oscillator 1710 oscillate at or close to the target frequency (generally, within a search margin), for example by performing a binary search or by operating as a frequency-locked loop. Frequency comparator 1770 is configured to output frequency difference signal 1708, which is or includes a signal related to the difference between the target frequency and the oscillator frequency. It captures an initial phase, and observes a change in phase relative to the initial phase.

In the example of a binary search, an embodiment may first program controlled oscillator 1710 to oscillate midway its frequency range, for example by setting an oscillator control code (that may be included in an oscillator control signal) most significant bit (msb) to 1 and all less significant bits to 0. It then compares the resulting output frequency with the target frequency. If the target frequency is higher than the measured frequency, the target frequency will be located in the upper half of the controlled oscillator 1710 frequency range, and if it is lower than the measured frequency, it will be located in the lower half of the controlled oscillator 1710 frequency range. The embodiment may thus deduce that the msb is a 1 or a 0, respectively. The embodiment then sets the next-significant bit to 1, thereby making the controlled oscillator 1710 oscillate midway the higher or lower half of the frequency range, respectively. Again, if the target frequency is higher than the measured frequency, this next-significant bit must be 1, and if it is lower than the measured frequency, this next-significant bit must be 0. The embodiment may repeat this process until all bits of the oscillator control code have been determined and the controlled oscillator 1710 frequency is within the search margin or at the target frequency. An embodiment may use a binary search as described here; a linear search; a jump search; an interpolation search; an exponential search; a Fibonacci search; a Newton-Raphson; or any other search method known in the art. The embodiment may use only the sign of the frequency difference, and thus find one bit of the oscillator control code per search cycle, or it may use both sign and amplitude and determine more than one oscillator control code bit per cycle. Once the search process has been completed, the embodiment copies relevant values into the various signals and provides controlled oscillator 1710 the oscillator control signal, which allows PLL 1700 to achieve phase lock much faster, since the oscillator frequency is already (close to) correct. The process is as follows.

At the start of a lock-in period, multiplexer 1790 allows search controller 1780 to provide controlled oscillator 1710 an oscillator control signal. In response, controlled oscillator 1710 will oscillate at a corresponding frequency, and phase accumulator 1720 will count or measure output clock signal 1703 clock cycles. The result is sampled by register 1730 when a reference clock signal 1701 pulse arrives, and made available at its output as sampled phase 1705. Frequency comparator 1770 issues search control signal 1709 to phase predictor 1740, which then loads sampled phase 1705 in an internal register to serve as an initial phase value for the predicted phase 1706. Phase subtractor 1750 subtracts the initial phase from predicted phase 1706 and produces phase difference signal 1707. Successive values of phase difference signal 1707 expose a change in phase relative to the initial phase. When certain conditions have been met, as will be detailed with reference to FIGS. 19 and 20, frequency comparator 1770 will use the output of phase subtractor 1750 as follows. If phase difference signal 1707 is positive, then predicted phase 1706 is higher than sampled phase 1705, meaning that the measured frequency is lower than the target frequency. If phase difference signal 1707 is negative, then the measured frequency is higher than the target frequency. Frequency comparator 1770 provides this change in phase relative to the initial phase (frequency difference signal 1708, which indicates a direction, and which may further include the magnitude) to search controller 1780. Thus, a frequency comparator 1770 measurement cycle provides a direction of frequency difference signal 1708, which in turn provides a bit for the oscillator control signal. Frequency comparator 1770 and search controller 1780 may repeat this cycle until all bits included in the oscillator control signal have been determined. Once the embodiment has determined all bits included in the oscillator control signal, the search has been completed. The embodiment may then: copy the oscillator control code, or one or more numbers derived from it, into loop filter 1760; switch multiplexer 1790 to the other position allowing loop filter 1760 to provide oscillator control signals to controlled oscillator 1710; and for one more time load sampled phase 1705 into phase predictor 1740 to ensure that lock-in can continue based on a small phase error. In embodiments, an oscillator control code may be included in an oscillator control signal, or an oscillator control signal may be derived from the oscillator control code, for example using a digital-to-analog converter. In some embodiments, search controller 1780 comprises a filter to reduce noise. In further embodiments, search controller 1780 may set parameters of loop filter 1760.

Figure 18:
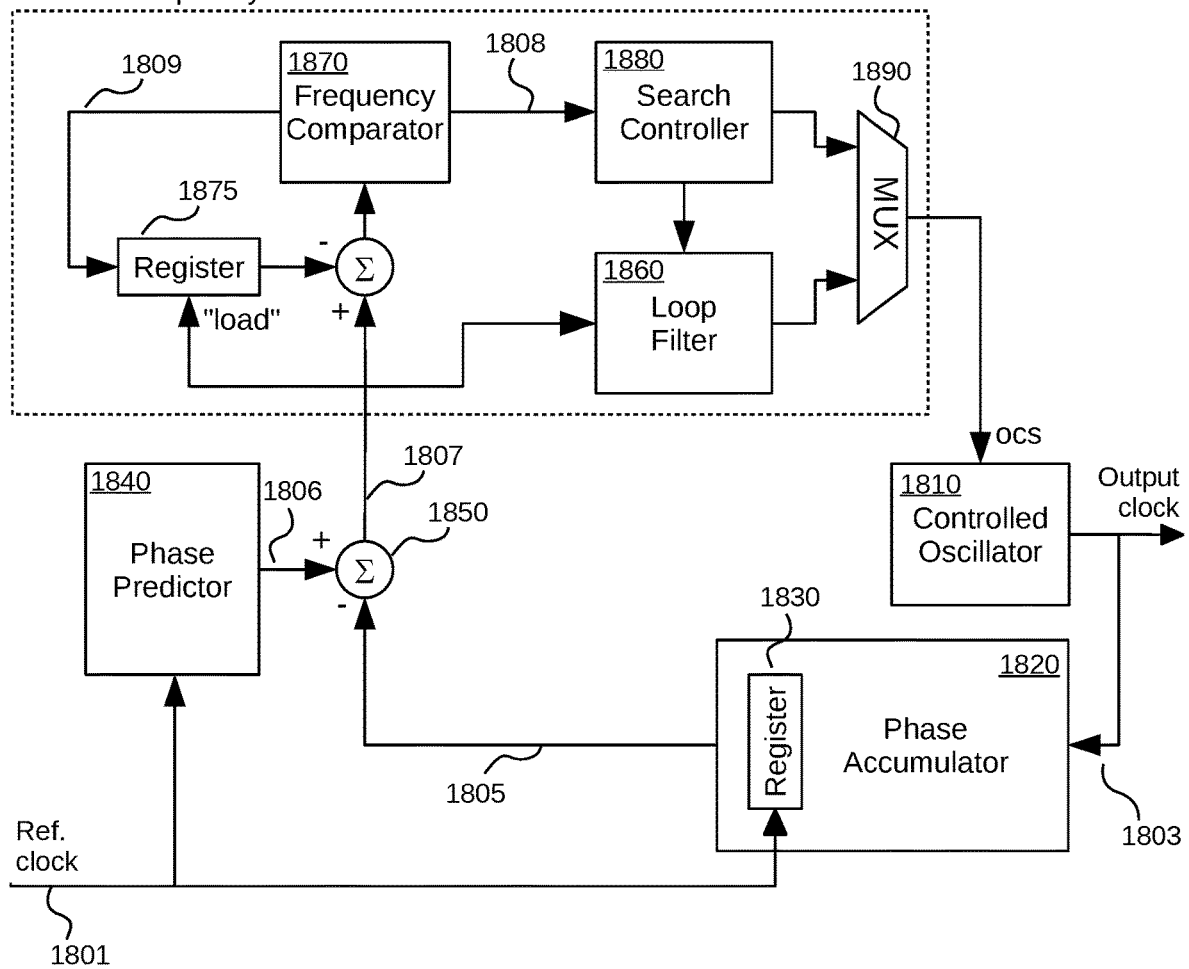
FIG. 18 illustrates an alternative PLL with a frequency comparator according to an embodiment of the invention.

FIG. 18 illustrates an alternative PLL 1800 with a frequency comparator 1870 according to an embodiment of the invention. PLL 1800 further includes controlled oscillator 1810, phase accumulator 1820, register 1830, which may be included in phase accumulator 1820, phase predictor 1840, phase subtractor 1850, loop filter 1860, register 1875, search controller 1880, and multiplexer 1890. PLL 1800 provides an output clock signal 1803, which must be based on a reference clock signal 1801 and an FCW. In this embodiment, frequency comparator 1870 does not load the value of measured phase 1805 into phase predictor 1840 as an initial phase value, but rather it loads the value of phase difference 1807 into register 1875 as an initial phase value and subtracts the register 1875 value from phase difference 1807 to obtain a signal that exposes the change in phase relative to the initial phase. If the signal is positive, the predicted phase 1806 is larger than the measured phase 1805, and vice versa if it is negative. The frequency comparator 1870 can work in a similar fashion as described for the embodiment in FIG. 17. It can achieve fast lock-in by enabling search controller 1880 to perform a search, such as a binary search, or it can allow PLL 1800 to function as a frequency locked loop during the lock-in period. The embodiment of FIG. 18 has one big advantage over the embodiment of FIG. 17 if PLL 1800 incorporates glitch correction in phase subtractor 1850. In such an embodiment, phase difference 1807 is glitch-corrected, and therefore lock-in can occur with more accurate values. Conversely, sampled phase 1705 is not glitch-corrected, which means that the embodiment in FIG. 17 may lose some lock-in time due to inaccuracies. In some embodiments, search controller 1880 comprises a filter to reduce noise. In further embodiments, search controller 1880 may set parameters of loop filter 1860.

Figure 19:
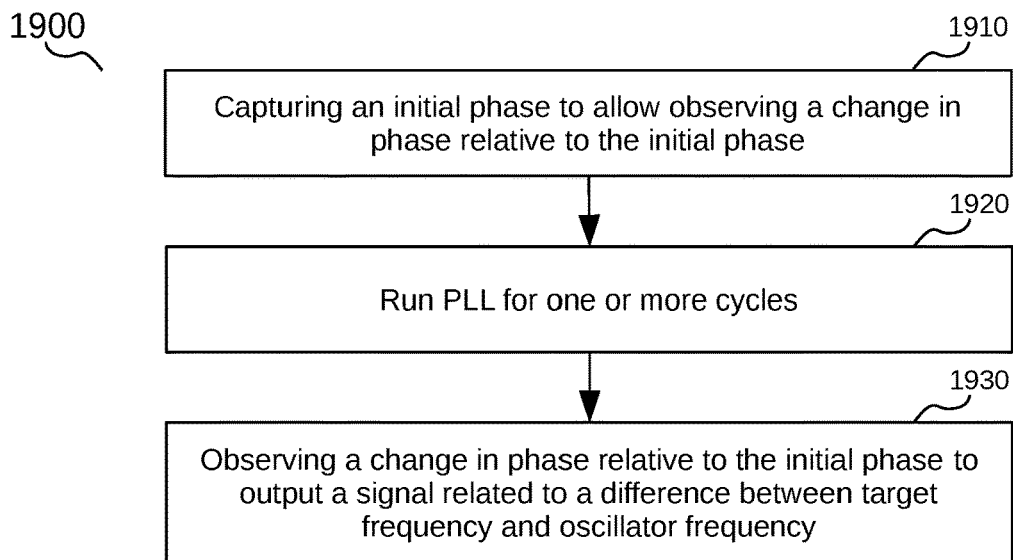
FIG. 19 illustrates a first method to predict a frequency difference prior to PLL lock according to an embodiment of the invention.

FIG. 19 illustrates a first method 1900 to observe a change in phase relative to an initial phase prior to PLL lock according to an embodiment of the invention. First method 1900 assumes a PLL as illustrated in FIG. 17 or FIG. 18. First method 1900 comprises the following steps.

Step 1910—capturing an initial phase to allow observing a change in phase relative to the initial phase. An embodiment may achieve this by loading sampled phase 1705 as an initial phase into phase predictor 1740. As a result, subsequent values of predicted phase 1706 provide the change in phase relative to the initial phase. Another embodiment may achieve this by loading a value of the phase difference 1807 as an initial phase into register 1875, so that the change in phase relative to the initial phase can be observed by subtracting the value in the register 1875 from the phase difference 1807.

Step 1920—running the PLL for one or more cycles of reference clock signal 1701 or reference clock signal 1801. Embodiments may use a sufficiently large number of cycles to reduce the relative impact of any noise components.

Step 1930—upon completing the one or more cycles, observing the change in phase relative to the initial phase to output a signal related to a difference between target frequency and oscillator frequency. The signal may include the sign and optionally the magnitude of phase difference signal 1707 or phase difference 1807. If the sign is positive, then the controlled oscillator 1710 or controlled oscillator 1810 frequency is too low, and if it is negative, then the controlled oscillator 1710 or controlled oscillator 1810 frequency is too high. In some embodiments, the magnitude of the frequency difference equals the phase difference signal 1707 magnitude times the reference clock signal 1701 frequency, divided by the number of the one or more cycles of reference clock signal 1701.

Figure 20:
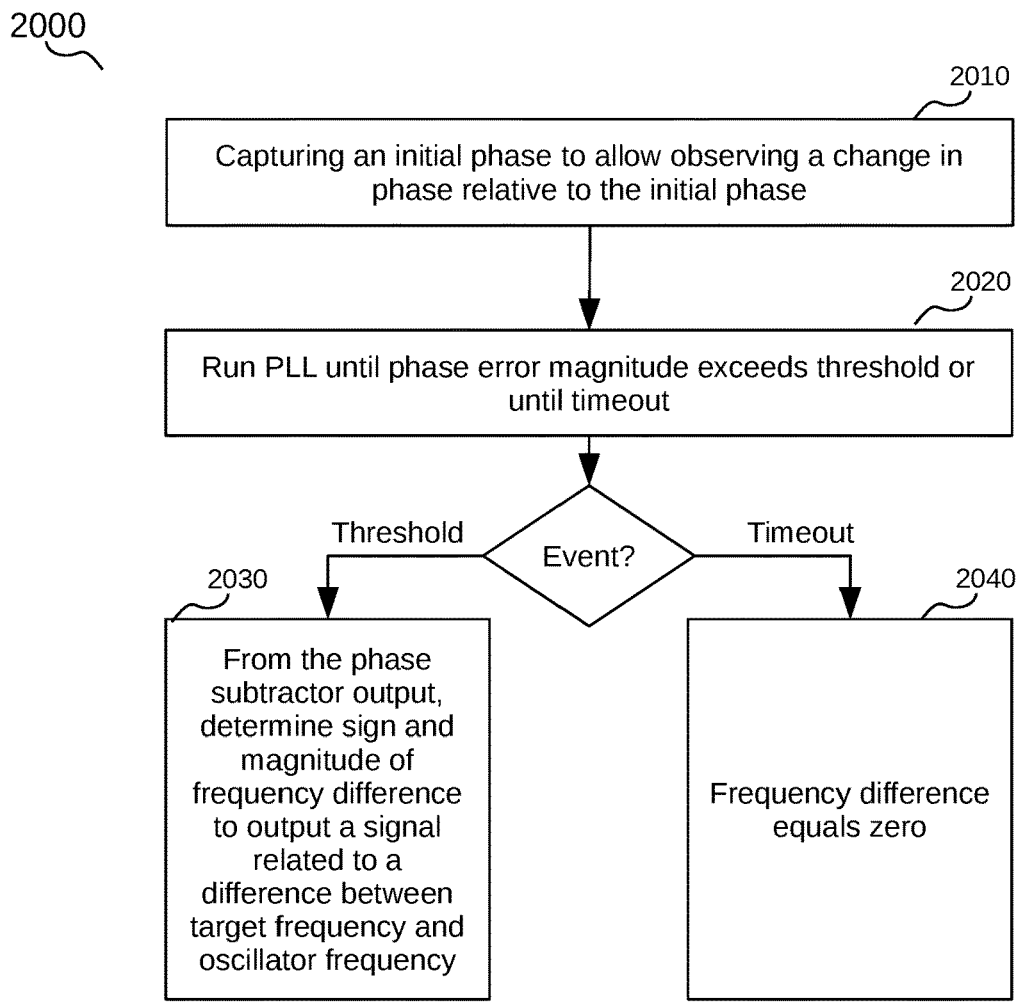
FIG. 20 illustrates a second method to predict a frequency difference prior to PLL lock according to an embodiment of the invention.

FIG. 20 illustrates a second method 2000 to observe a change in phase relative to the initial phase prior to PLL lock according to an embodiment of the invention. Second method 2000 assumes a PLL as illustrated in FIG. 17 or FIG. 18. Second method 2000 comprises the following steps.

Step 2010—capturing an initial phase to allow observing a change in phase relative to the initial phase. An embodiment may achieve this by loading sampled phase 1705 as an initial phase into phase predictor 1740. As a result, subsequent values of predicted phase 1706 provide the change in phase relative to the initial phase. Another embodiment may achieve this by loading a value of the phase difference 1807 as an initial phase into register 1875, so that the change in phase relative to the initial phase can be observed by subtracting the value in the register 1875 from the phase difference 1807.

Step 2020—running the PLL and counting a number Y of reference clock signal 1701 cycles until the phase difference signal 1707 magnitude exceeds a threshold (or of reference clock signal 1801 cycles until the frequency comparator 1870 input signal magnitude exceeds a threshold), or until a timeout is reached. An embodiment may determine the timeout by comparing Y with a timeout value $Y_{MAX}$, or by any other method known in the art to measure the lapse of time. Embodiments use a sufficiently large threshold to reduce the relative impact of any noise components.

Step 2030—upon exceeding the threshold, determining sign and optionally the magnitude of phase difference signal 1707 or of the frequency comparator 1870 input signal. If the signal is positive, then the controlled oscillator 1710 or 1810 frequency is too low, and if it is negative, then the controlled oscillator 1710 or 1810 frequency is too high. The magnitude of the frequency difference equals the phase difference signal 1707 or frequency comparator 1870 input signal magnitude times the reference clock signal 1701 frequency, divided by Y.

Step 2040 (optional)—upon reaching timeout, declaring the frequency difference to be zero.

PLL with Phase Range Extension

In some applications, the momentary phase of a PLL's reference clock may deviate very substantially from its average value. For example, the ITU-T Recommendation G.813 specifies that a reference clock pulse may come from 2.5 μs early to 2.5 μs late. A PLL's DCO clock frequency may be, for example, 15 GHz, having a cycle time of 66.7 ps. To measure the reference clock's phase error (i.e., phase difference) in full cycles of the DCO clock would mean measuring 37,500 cycles, which requires at least a 17-bit counter. As was discussed previously in this patent document, a counter with many bits may consume much power. Embodiments of the invention avoid this by using a phase accumulator, phase predictor and phase subtractor with a limited unextended range and keeping track of the number of times that an excursion occurs of the unextended range. Some embodiments focus on excursions where the phase difference exceeds one end of the limited unextended range and is mapped through the other end. For example, an upward excursion may occur when the phase difference exceeds the top of the range and a downward excursion occurs when the phase difference exceeds the bottom of the range. However, other embodiments focus on upward and downward excursions of another range threshold point, as will be explained with reference to FIG. 24. While keeping track of excursions in a circular numbering system, downward excursions compensate for upward excursions, and vice versa. A circular numbering system is a numbering system in which the code for the lowest represented number can be obtained by incrementing the code for the highest represented number by 1, and vice versa.

Although systems supporting a standard such as G.813 may have huge phase errors, these phase errors build slowly over time as the frequency variation of the DCO clock is kept very small. As a result, the values for successive phase errors will be very close to each other unless an excursion occurs. This happens very infrequently, and it can be detected using simple circuitry with a small bit width. Therefore, embodiments may provide an ultra-wide range extension using very little power.

One embodiment remedies the situation with the power-saving phase accumulator 900 discussed with reference to FIG. 9. However, FIGS. 21-28 show embodiments that may save even more power.

FIG. 21 illustrates pseudo code 2100 for a PLL with range extension according to an embodiment of the invention. Pseudo code 2100 includes lines numbered 2101-2114. Pseudo code 2100 centers around a phase comparator (phase subtractor) whose output is a phase difference (phase_difference). The phase difference is expressed as a 2's complement code with a minimum value−K/2 and a maximum value K/2−1, wherein K expresses an unextended phase range, and pseudo code 2100 focuses on excursions at the top and bottom of the phase difference range, i.e. it has range threshold points at −K/2 and K/2−1. The embodiment uses a parameter (range_ext_steps) to track range excursions, the parameter denoting the number of times the phase difference has exceeded its lower range threshold point −K/2 minus the number of times the phase difference has exceeded its upper range threshold point K/2−1. In line 2101, the embodiment initializes range_ext_steps to zero. The embodiment may then enter a loop including lines 2102 to 2114.

The embodiment remembers a prior value (last_phase_difference) in line 2102. It updates phase_difference in line 2103 in the manner explained in previous embodiments by taking a difference between a predicted phase (phase_prediction) from a phase predictor and a measured phase (phase_measurement) from a phase accumulator. However, the embodiment adds a value calculated from the multiplication of unextended phase range K and range_ext_steps. In line 2104, the embodiment calculates a difference (phase_diff_diff) between the present value of the phase difference and the prior value.

In line 2106, the embodiment compares phase_diff_diff with the upper threshold point K/2−1. If phase_diff_diff is a larger number, then the embodiment decrements range_ext_steps by 1 (line 2107), and decrements phase_difference by K (line 2108).

In line 2110, the embodiment compares phase_diff_diff with the lower threshold point −K/2. If phase_diff_diff is a smaller number, then the embodiment increments range_ext_steps by 1 (line 2111) and increments phase_difference by K (line 2112).

An example manner in which an embodiment determines whether the phase difference exceeds its range is as follows. When phase errors build slowly over time, the values for phase_difference and last_phase_difference will generally be very close to each other. Therefore, phase_diff_diff will usually be close to zero, or generally, a valid range for phase_diff_diff will be dependent on system design parameters, and can therefore be known to be, for example, from −K/4 to K/4 in one application, or from −K/1000 to K/1000 in another application. However, when a range excursion occurs, phase_difference and last_phase_difference end up on opposite sides of the phase range, in this example −K/2 to K/2−1, and phase_diff_diff will significantly exceed its known valid range. The direction of the range excursion dictates the sign of phase_diff_diff. The range excursion causes the amplitude of phase_diff_diff to be outside of its valid range. Some embodiments may test phase_diff_diff strictly for exceeding its known valid range. Other embodiments, including the example embodiment 2100, add some margin to this, for example to reduce noise, and test at larger limits, such as −K/2 and K/2−1.

Although some embodiments may calculate phase_diff_diff by subtracting all last_phase_difference bits from all phase_difference bits, most of the bits may have no impact on the result. In an embodiment, only a few of the most significant bits, for example the two most significant bits of the unextended phase range, may impact the result. Therefore, some other embodiments may determine only those few most significant bits of phase_diff_diff, and subtract only the few most significant bits of last_phase_difference from the few most significant bits of phase_difference. Further embodiments may only store the few most significant bits of last_phase_difference, as the remaining bits have no impact on phase_diff_diff.

FIG. 22 illustrates alternative pseudo code 2200 for a PLL with range extension according to an embodiment of the invention. Pseudo code 2200 includes lines numbered 2201-2214. Pseudo code 2200 is different than pseudo code 2100 in that it uses values of the current and previous unextended phase difference to determine if an excursion occurs.

Figure 23:
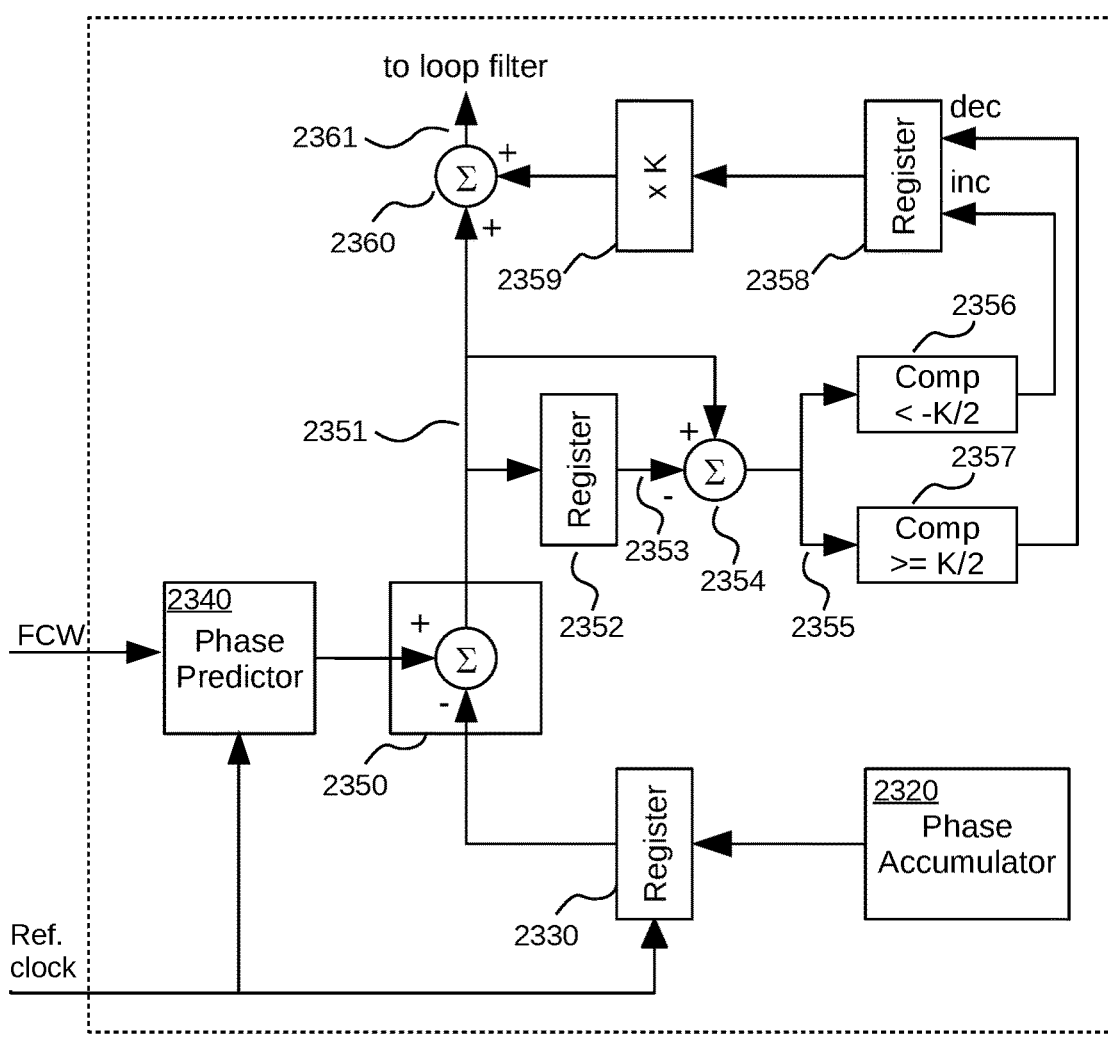
FIG. 23 illustrates an example PLL with range extension for an arbitrary range value K according to an embodiment of the invention.

FIG. 23 illustrates an example PLL 2300 with range extension for an arbitrary range value K according to an embodiment of the invention. FIG. 23 implements the method of FIG. 22. As in previous embodiments, K is the larger of a maximum phase to be measured in a phase accumulator and a maximum phase to be predicted in a phase predictor. In this example, an unextended phase range may span from −K/2 to K/2−1, as in a two's complement code, or more generally, in a circular numbering system the range may span from the lower threshold point to the higher threshold point. PLL 2300 includes phase accumulator 2320, measured phase register 2330 (which may be included in phase accumulator 2320), phase predictor 2340, phase subtractor 2350, last phase difference register 2352, difference difference subtractor 2354, bottom excursion comparator 2356, top excursion comparator 2357, range extension steps register 2358 which may be included in a counter, multiplier 2359, and phase extension adder 2360. Phase accumulator 2320, measured phase register 2330, and phase predictor 2340 function as in any other embodiment. Phase subtractor 2350 subtracts a measured phase register 2330 output value from a phase predictor 2340 output value to calculate an unextended phase difference 2351. Last phase difference register 2352 holds and outputs an unextended phase difference previous value 2353. Difference difference subtractor 2354 calculates a phase_diff_diff value 2355 by subtracting unextended phase difference previous value 2353 from unextended phase difference 2351. Bottom excursion comparator 2356 determines if an excursion occurs at the lower threshold point by comparing phase_diff_diff value 2355 with −K/2. If phase_diff_diff value 2355 is less than the lower threshold point −K/2, then bottom excursion comparator 2356 triggers an increment input of range extension steps register 2358. Top excursion comparator 2357 determines if an excursion occurs at the higher threshold point by comparing phase_diff_diff value 2355 with K/2. If phase_diff_diff value 2355 is larger than or equal to higher threshold point K/2, then top excursion comparator 2357 triggers a decrement input of range extension steps register 2358. When triggered, range extension steps register 2358 increments or decrements its output value (the range_ext_steps parameter) accordingly. Multiplier 2359 takes this output value, and multiplies it by K. Phase extension adder 2360 adds the multiplier 2359 output value to the unextended phase difference 2351 to obtain an extended phase difference 2361 value that the embodiment forwards to a loop filter. The range of extended phase difference 2361 depends on the bit width of range extension steps register 2358. If range extension steps register 2358 has a range of L, then the range of extended phase difference 2361 is K*L, for example from −L*K/2 to L*K/2−1.

Some embodiments may use only a few significant bits, for example the two most significant bits, of the unextended phase difference register 2351 to store in last phase difference register 2352 and subtract from unextended phase difference previous value 2353 in the difference difference subtractor 2354. In those embodiments, the bit width of phase_diff_diff value 2355 will be reduced and both bottom excursion comparator 2356 and top excursion comparator 2357 will operate with fewer bits to determine if a range excursion occurs. For example, embodiments with K=48 or K=64 would associate a bit width of 6 bits with K. If only the two most significant bits impact a range excursion, then phase subtractor 2350 would be 6 bits wide, whereas last phase difference register 2352, difference difference subtractor 2354, bottom excursion comparator 2356, and top excursion comparator 2357 would be 2 bits wide. Range extension steps register 2358 may have any number of bits to allow for an ultra-wide extended phase range.

FIG. 24 illustrates how a PLL can alternatively provide range extension according to an embodiment of the invention. The method works when K is a whole power of two, such as 2, 4, 8, etc. In the example in FIG. 24, the PLL's phase accumulator and phase predictor have a small (unextended) range with K=4, in this case from −2 to +1. The numbering system is circular, and in this case two's complement. As will be shown, a range threshold point in between the top and the bottom of the range can be used fruitfully. FIG. 24 shows table 2400, whose first column shows an extended range in decimal numbers. The extended range is also kept small, from −8 to +7. The bits produced by the phase subtractor are shown in the third column. The second column shows the two bits concatenated as most significant bits and stored in a range extension register, which may be included in an up/down counter. As can be seen from table 2400, the bits in the second column concatenated with the bits in the third column provide the two's complement code for the extended range shown as a decimal number in the first column.

Although the phase subtractor wraps around from a two's complement value 01 (=+1) to 10 (=−2) or vice versa, the extended bits remain the same for those values. Such wrap arounds occur in the extended range at 5 and 6; 1 and 2; −2 and −3; and −6 and −7. Nothing needs to be done to achieve range extension at these points. However, the extended range bits change at 4 and 3; 0 and −1; and −4 and −5, threshold points in the middle of the phase difference range. For example, an upward excursion occurs when the extended range bits increment (second column, from 00 to 01) when the extended range phase difference goes from 3 to 4. They also increment (and upward excursions occur) (second column from 11 to 00) when the extended range phase difference goes from −1 to 0, and (second column from 10 to 11) when the extended range phase difference goes from −5 to −4. In all these cases, the phase difference in the third column goes from 11 (prior value equals −1) to 00 (current value equals 0). From this, it can be concluded that an upward excursion occurs and the bits in the range extension register must increment when the prior value equals −1 and the current value equals 0. Conversely, a downward excursion occurs and the bits in the range extension register must decrement when the prior value equals 0 and the current value equals −1. Therefore, FIG. 24 shows that bits in the range extension register can be concatenated with unextended phase difference bits to obtain an extended phase difference using a single range threshold point whose value lies between 0 and −1. It must be noted that even when the K value is higher (e.g. 8, 16, 32, etc.), the excursion can be detected by looking at only the two most significant bits of the phase difference. The table of FIG. 24 remains valid for any number of additional more significant bits of the range extension, or less significant bits of the unextended phase range.

FIG. 25 illustrates pseudo code 2500 for the example in FIG. 24 for a PLL with range extension according to an embodiment of the invention. The method begins in line 2501 by initializing the range extension register to 0 (or to another predetermined value). It then enters a loop from line 2502 to 2513 that begins with updating a prior phase difference register in line 2502. The register may hold as few as the two most significant bits of the phase difference. Line 2503 determines an updated phase difference by subtracting a measured phase (provided by the phase accumulator) from a predicted phase (provided by the phase predictor). Line 2504, which is optional, determines the at least two most significant bits of the phase difference. Lines 2506-2508 determine if a downward excursion occurs (prior value equals 0 and the current value equals −1), and lines 2509-2511 determine if an upward excursion occurs (prior value equals −1 and the current value equals 0). Line 2512 determines the extended phase difference by adding K times the range extension register value to the phase difference. As discussed, the multiplication and addition can be achieved at the same time by concatenating the range extension register bits as most significant bits to the (unextended) phase difference bits.

FIG. 26 illustrates an example PLL 2600 with range extension for the method in FIGS. 24 and 25 according to an embodiment of the invention. PLL 2600 includes phase accumulator 2620, measured phase register 2630, phase predictor 2640, phase subtractor 2650, last phase difference register 2652, first current value comparator 2654, second current value comparator 2655, first prior value comparator 2656, second prior value comparator 2657, decrement detector gate 2658, increment detector gate 2659, and range extension register 2662 which may be included in an up/down counter. Signals include unextended phase difference 2651, prior unextended phase difference 2653, decrement signal 2660, increment signal 2661, and extended phase range bits 2663. As in other PLLs described in this document phase accumulator 2620 and phase predictor 2640 provide the signals for phase subtractor 2650, which calculates the unextended phase difference 2651 upon receiving a reference clock signal. Last phase difference register 2652 holds a prior version of at least the two most significant bits of unextended phase difference 2651. First current value comparator 2654, first prior value comparator 2656, and decrement detector gate 2658 determine if a decrement of the value in range extension register 2662 needs to occur by determining that the previous phase difference was higher than the range threshold point and the current phase difference is lower than the range threshold point. Second current value comparator 2655, second prior value comparator 2657, and increment detector gate 2659 determine if an increment of the value in range extension register 2662 needs to occur by determining that the previous phase difference was lower than the range threshold point and the current phase difference is higher than the range threshold point. Decrement detector gate 2658 decrements and increment detector gate 2659 increments range extension register 2662. The embodiment concatenates the bits in range extension register 2662 to the bits of unextended phase difference 2651, and present the resulting extended phase range to the PLL's loop filter.

Figure 27:
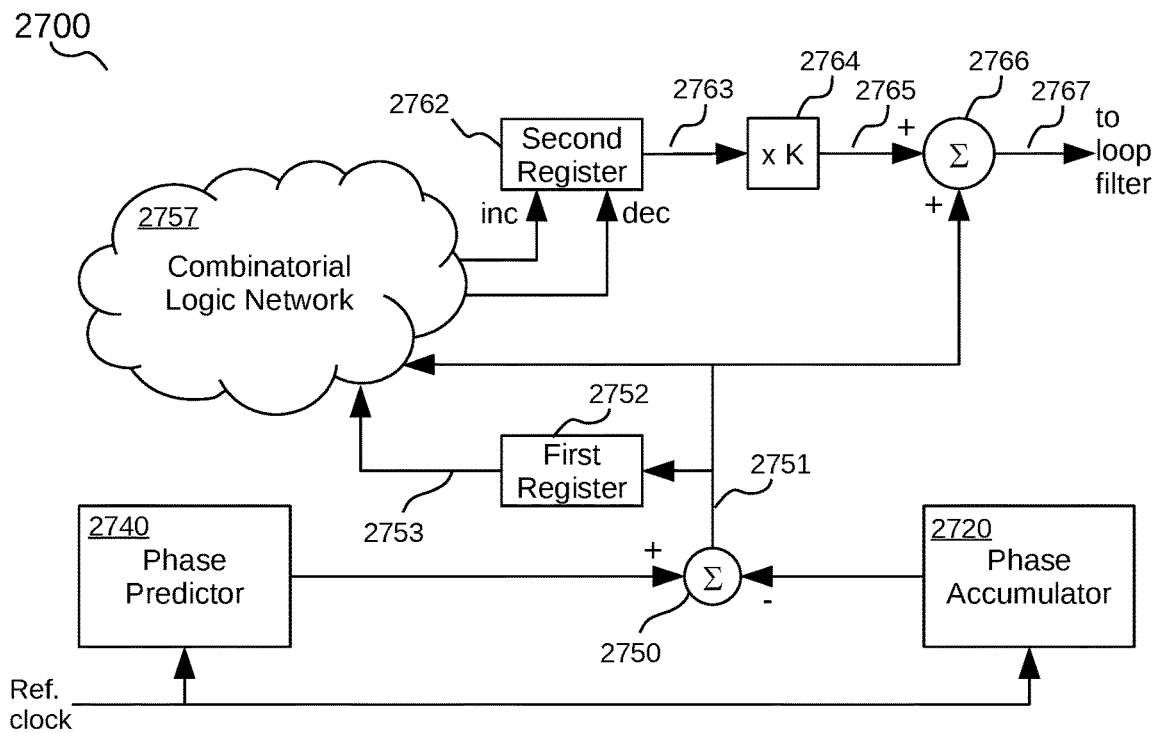
FIG. 27 illustrates generalized circuitry for phase difference range extension according to an embodiment of the invention.

FIG. 27 illustrates generalized circuitry 2700 for phase difference range extension according to an embodiment of the invention. FIG. 27 is derived from FIG. 23 and FIG. 26 on the basis that the function of comparators 2356-2357 or 2654-2657 and AND gates 2658-2659 can be achieved with different (but equivalent) networks of combinatorial logic, and that in fact a silicon compiler program will translate the circuits as presented here to one that is optimized for the semiconductor and transistor technology available to an IC designer. Circuitry 2700 includes phase accumulator 2720, phase predictor 2740, phase subtractor 2750, first register 2752, second register 2762 which may be included in an up/down counter, and combinatorial logic network 2757. Some embodiments further include scaler 2764 and adder 2766. Upon receiving a reference clock signal, phase subtractor 2750 determines unextended phase difference 2751 by subtracting a measured phase delivered by phase accumulator 2720 from a predicted phase delivered by phase predictor 2740. Combinatorial logic network 2757 uses two or more most significant bits from unextended phase difference 2751 and two or more most significant bits from the previous value of unextended phase difference 2751 stored in first register 2752 to determine if a phase difference excursion occurs, which may be an upward excursion or a downward excursion, based on one or two range threshold points. When an upward excursion occurs, combinatorial logic network 2757 asserts an increment signal (inc), and when a downward excursion occurs combinatorial logic network 2757 asserts a decrement signal (dec). The inc signal increments the value 2763 stored in second register 2762, whereas the dec signal decrements it. The embodiment multiplies value 2763 by K in scaler 2764 and adds the result 2765 to unextended phase difference 2751 in adder 2766 to calculate an extended phase difference 2767 that the PLL presents to a loop filter. Some embodiments (those with two range threshold points) achieve this multiplication and addition by using dedicated logic, i.e., scaler 2764 and adder 2766. Embodiments with a single range threshold point may achieve this multiplication and addition by concatenating the bits of value 2763 to the bits of unextended phase difference 2751, where the bits of value 2763 become the most significant bits and the bits of unextended phase difference 2751 become the less significant bits of extended phase difference 2767.

Figure 28:
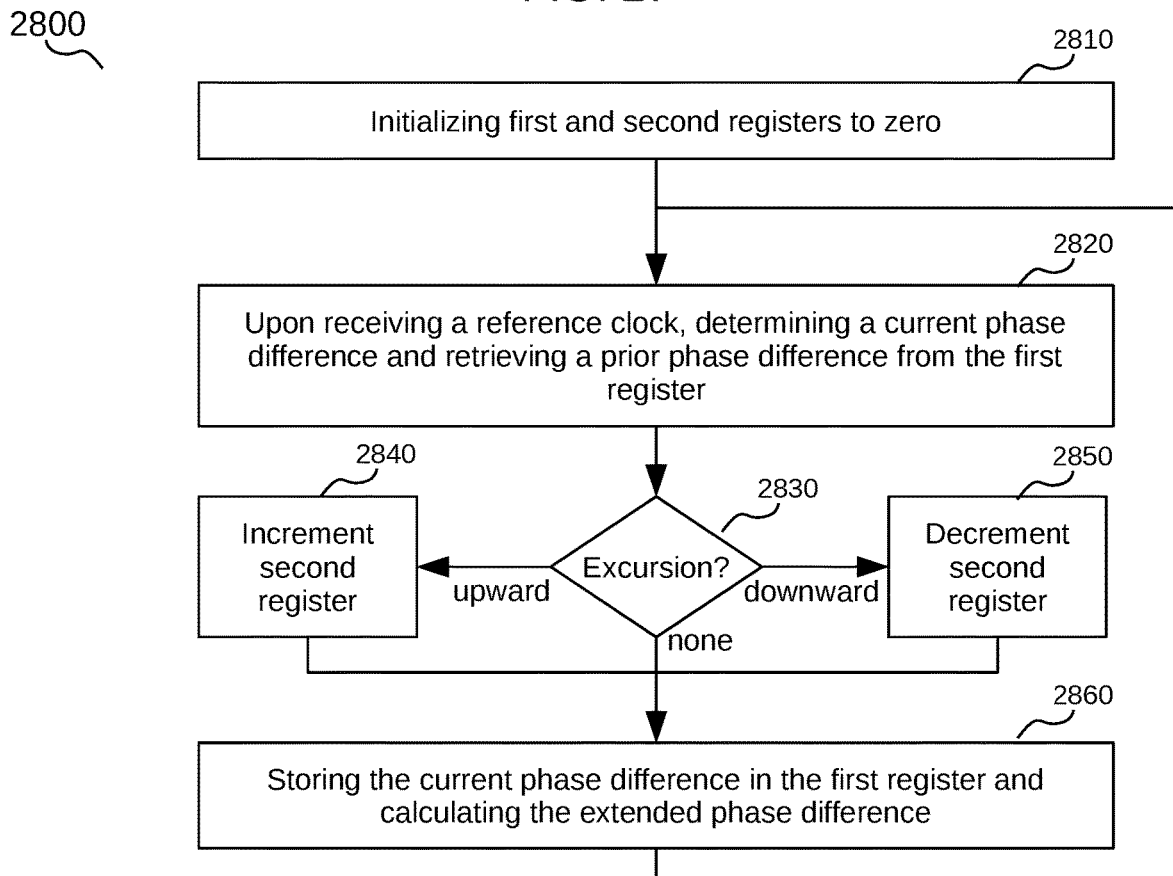
FIG. 28 illustrates a generalized method to achieve phase difference range extension according to an embodiment of the invention.

FIG. 28 illustrates a generalized method 2800 to achieve phase difference range extension according to an embodiment of the invention. Method 2800 is suitable for use with the circuitry 2700 in FIG. 27, or the more specific versions in FIGS. 23 and 26. Method 2800 includes the following steps.

Step 2810—initializing a first register and a second register to zero. The first register may be two or more bits wide and will be used for storing two or more bits of the unextended phase difference. The second register has a bit width that determines by which factor the unextended phase difference range is extended. For example, if the unextended phase difference range equals K, and the second register has a width of 12 bits (i.e., its range equals $2^{12}=4096$), then the extended phase difference range will be 4096 times K. Some embodiments may initialize the first register or the second register to a different value than zero.

Step 2820—upon receiving a reference clock signal, determining a current unextended phase difference by subtracting a measured phase from a predicted phase, and retrieving two or more most significant bits from a previous unextended phase difference stored in the first register.

Step 2830—in a combinatorial logic network, using two or more most significant bits from the current unextended phase difference and the retrieved two or more most significant bits from the previous unextended phase difference to determine if an excursion occurs. There are three possible outcomes: (1) no range excursion occurs; (2) an upward excursion occurs; or (3) a downward excursion occurs. Excursions may be based upon a single range threshold point situated in between the bottom and top of the phase difference range as illustrated in FIG. 24, or two range threshold points, one situated below the bottom of the range and one situated above the top of the range as illustrated in FIGS. 21 to 23.

Step 2840—upon determining that an upward excursion occurs, incrementing a value stored in the second register.

Step 2850—upon determining that a downward excursion occurs, decrementing the value stored in the second register.

Step 2860—storing the two or more most significant bits of the current unextended phase difference in the first register and calculating an extended phase difference. Some embodiments determine the extended phase difference by concatenating the bits stored in the second register to the bits of the unextended phase difference. Other embodiments determine the extended phase difference by multiplying the value stored in the second register with the value of the unextended phase difference range and adding it to the current unextended phase difference.

General

It will be understood that the invention disclosed and defined in this specification extends to all alternative combinations of two or more of the individual features mentioned or evident from the text or drawings. All of these different combinations constitute various alternative aspects of the invention.

Although the description has been described with respect to particular embodiments thereof, these particular embodiments are merely illustrative, and not restrictive. For instance, many of the operations can be implemented on a printed card board PCB using off-the-shelf devices, in a System-on-Chip (SoC), application-specific integrated circuit (ASIC), programmable processor, or in a programmable logic device such as a field-programmable gate array (FPGA), obviating a need for at least part of the dedicated hardware. All such variations and modifications are to be considered within the ambit of the present invention the nature of which is to be determined from the foregoing description.

Any suitable technology for manufacturing electronic devices can be used to implement the circuits of particular embodiments, including bipolar, JFET, MOS, NMOS, PMOS, CMOS, BiCMOS, HBT, MESFET, FinFET, etc. Different semiconductor materials can be employed, such as silicon, germanium, SiGe, GaAs, InP, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular embodiments. In some particular embodiments, multiple elements, devices, or circuits shown as sequential in this specification can be operating in parallel.

Particular embodiments or parts of an embodiment may be implemented in a tangible, non-transitory computer-readable storage medium for use by or in connection with an instruction execution system, apparatus, system, or device. Particular embodiments can be implemented in the form of control logic in software, firmware, hardware or a combination of those. The control logic, when executed by one or more processors, may be operable to perform that which is described in particular embodiments. For example, a tangible medium such as a hardware storage device can be used to store the control logic, which can include executable instructions.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

The invention claimed is:

1. A power-saving phase accumulator, comprising:
   a fast counter configured to count cycles of a clock signal;
   first latches coupled with a fast counter output and configured to sample and store a fast counter output value upon receiving a reference clock signal, the fast counter output value representing one or more less significant bits of an integer clock phase; and
   a low-power counter with a clock input configured to receive and count pulses of a fast counter carry signal;
   third latches coupled with a low-power counter output and configured to sample and store a low-power counter output value upon receiving the reference clock signal, the low-power counter output value representing one or more most significant bits of the integer clock phase.

2. The power-saving phase accumulator of claim 1, wherein a fast counter output sequence changes only one bit per counted clock signal.

3. The power-saving phase accumulator of claim 1, wherein a low-power counter output sequence changes only one bit per counted carry signal pulse.

4. The power-saving phase accumulator of claim 2, further comprising a binary encoder with an input coupled with an output of the first latches to convert the integer clock phase to a binary number.

5. The power-saving phase accumulator of claim 3, further comprising a binary encoder with an input coupled with an output of the third latches to convert the integer clock phase to a binary number.

6. The power-saving phase accumulator of claim 1, further comprising:
   a delay line configured to receive the clock signal and including multiple output taps along which the clock signal propagates;
   second latches coupled with the delay line output taps and configured to sample and store delay line output tap values upon receiving the reference clock signal; and
   a delay line decoder coupled with outputs of the second latches and configured to translate a series of successive equal bit values signifying fractional progress of a clock signal pulse to a binary number representing a fractional clock phase.

7. The power-saving phase accumulator of claim 6, further comprising an optional calibrator with an input coupled with the delay line decoder output and with an output coupled with the delay line, wherein the optional calibrator is configured to keep a number of delay line steps per clock signal pulse stable regardless of changes in operating conditions.

8. The phase accumulator of claim 7, wherein the optional calibrator keeps the number of delay line steps per clock signal pulse stable by repeatedly measuring an actual number of delay line steps per clock signal pulse and averaging results to obtain an accurate number.

9. The phase accumulator of claim 7, wherein the optional calibrator forms a negative feedback loop with the delay line, second latches, and delay line decoder to keep an average number of delay line steps per clock signal pulse equal to a required number of delay line steps per clock signal pulse.

* * * * *